(12) United States Patent
Kuttner et al.

(10) Patent No.: US 9,571,120 B2
(45) Date of Patent: Feb. 14, 2017

(54) DIGITAL TO ANALOG CONVERTER CIRCUITS, APPARATUS AND METHOD FOR GENERATING A HIGH FREQUENCY TRANSMISSION SIGNAL AND METHODS OF DIGITAL TO ANALOG CONVERSION

(71) Applicant: Intel IP Corporation, Santa Clara, CA (US)

(72) Inventors: Franz Kuttner, St. Ulrich (AT); Antonio Passamani, Mori (AT); Davide Ponton, Warmbad-Villach (AT)

(73) Assignee: Intel IP Corporation, Santa Clara, CA (US)

(*) Notice: Subject to any disclaimer, the term of this patent is extended or adjusted under 35 U.S.C. 154(b) by 0 days.

(21) Appl. No.: 14/835,031

(22) Filed: Aug. 25, 2015

(65) Prior Publication Data

US 2016/0094235 A1    Mar. 31, 2016

(30) Foreign Application Priority Data

Sep. 25, 2014 (DE) .................. 10 2014 113 922

(51) Int. Cl.
| | | |
|---|---|---|
| *H03M 1/66* | (2006.01) | |
| *H03M 1/74* | (2006.01) | |
| *H03M 1/00* | (2006.01) | |
| *H03M 1/12* | (2006.01) | |
| *H03M 3/00* | (2006.01) | |

(52) U.S. Cl.
CPC ............... *H03M 1/662* (2013.01); *H03M 1/00* (2013.01); *H03M 1/12* (2013.01); *H03M 1/74* (2013.01); *H03M 1/747* (2013.01); *H03M 3/30* (2013.01)

(58) Field of Classification Search
CPC .......... H03M 1/747; H03M 1/00; H03M 3/30; H03M 1/12
USPC ......... 341/144, 143, 110, 120, 122, 123, 150
See application file for complete search history.

(56) References Cited

U.S. PATENT DOCUMENTS

| | | |
|---|---|---|
| 2006/0291589 A1 | 12/2006 | Eliezer et al. |
| 2010/0265112 A1 | 10/2010 | Ek et al. |
| 2012/0194366 A1* | 8/2012 | Zare-Hoseini ...... H03M 1/0665 341/110 |
| 2014/0254720 A1 | 9/2014 | Deng et al. |

FOREIGN PATENT DOCUMENTS

EP    2658116 A1    10/2013

OTHER PUBLICATIONS

Fulde, M. et al. "Innovative RFDAC Concepts for Digital Multi-Mode Transmitter in Cellular Applications." IEEE, PRIME 2013, Villach, Austria, Plenary Papers, pp. 9-10.

* cited by examiner

*Primary Examiner* — Joseph Lauture
(74) *Attorney, Agent, or Firm* — Eschweiler & Associates, LLC

(57) ABSTRACT

A digital to analog converter circuit includes a plurality of digital to analog converter cells. The digital to analog converter circuit further includes a control circuit configured to control an operation of a digital to analog converter cell of the plurality of digital to analog converter cells based on a first phase component of a digital signal comprising information to be transmitted during a first time interval and based on a second phase component of the digital signal comprising information to be transmitted during a second time interval.

24 Claims, 21 Drawing Sheets

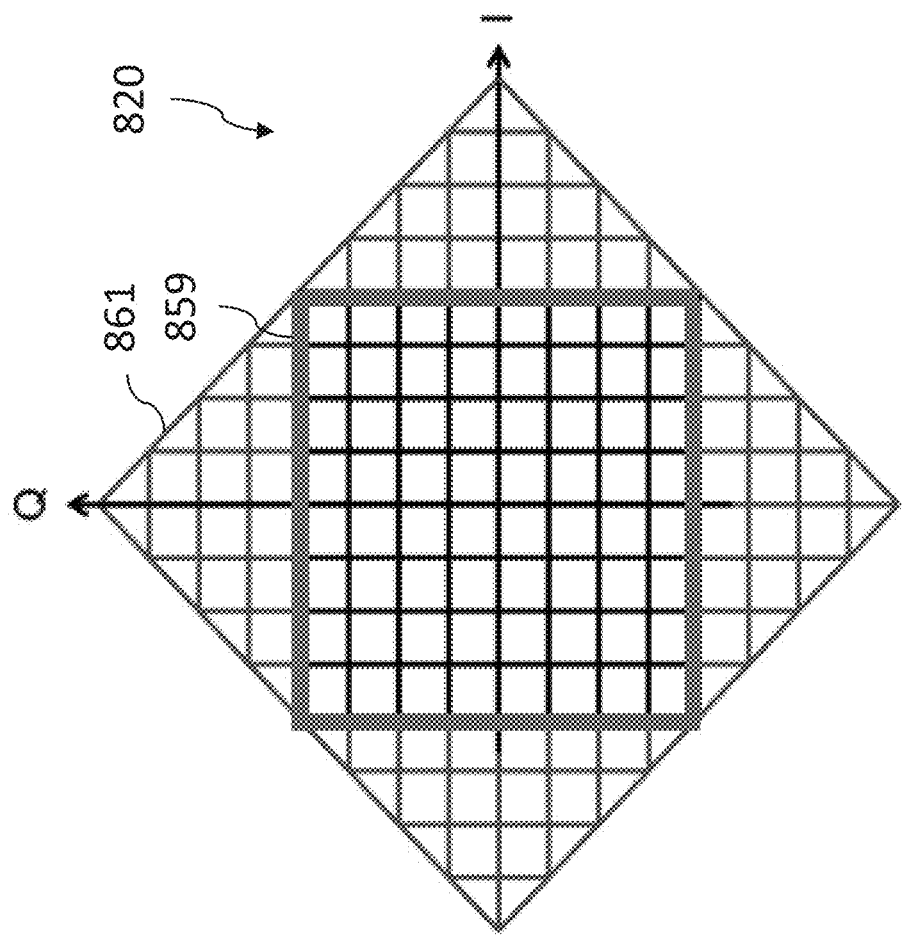
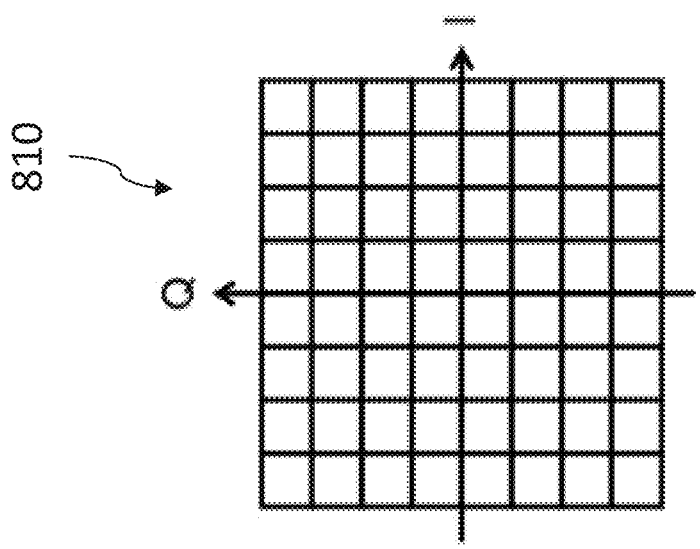
FIG 8A

US 9,571,120 B2

DIGITAL TO ANALOG CONVERTER CIRCUITS, APPARATUS AND METHOD FOR GENERATING A HIGH FREQUENCY TRANSMISSION SIGNAL AND METHODS OF DIGITAL TO ANALOG CONVERSION

CROSS REFERENCE TO RELATED APPLICATIONS

This application claims priority to German Application number 102014113922.4, filed on Sep. 25, 2014, the contents of which are herein incorporated by reference in its entirety.

FIELD

The present disclosure relates to the conversion of digital signals to analog signals and in particular to digital to analog converter circuits, an apparatus and a method for generating a high frequency transmission signal and methods of digital to analog conversion.

BACKGROUND

Radio frequency (RF) output signals may be generated with polar architecture or in-phase and quadrature (IQ) architecture. A polar radio frequency digital to analog converter (RFDAC) may use all cells to generate an output signal, for example. Polar RFDACs may suffer from non-uniform distribution, and most bits e.g. bits (f) may be where they are not needed, for example.

IQ transmitter lineups have two DACs, one for the in-phase I path, and one for the quadrature Q path. IQ architecture may be simple but may suffer from lower efficiency and lower output power. It is desired to improve the transmitter efficiency.

BRIEF DESCRIPTION OF THE DRAWINGS

Some examples of apparatuses and/or methods will be described in the following by way of example only, and with reference to the accompanying figures, in which

FIGS. 8A to 8C show schematic illustrations of constellation diagrams for implementing a digital to analog converter circuit;

DETAILED DESCRIPTION

Figure 1:
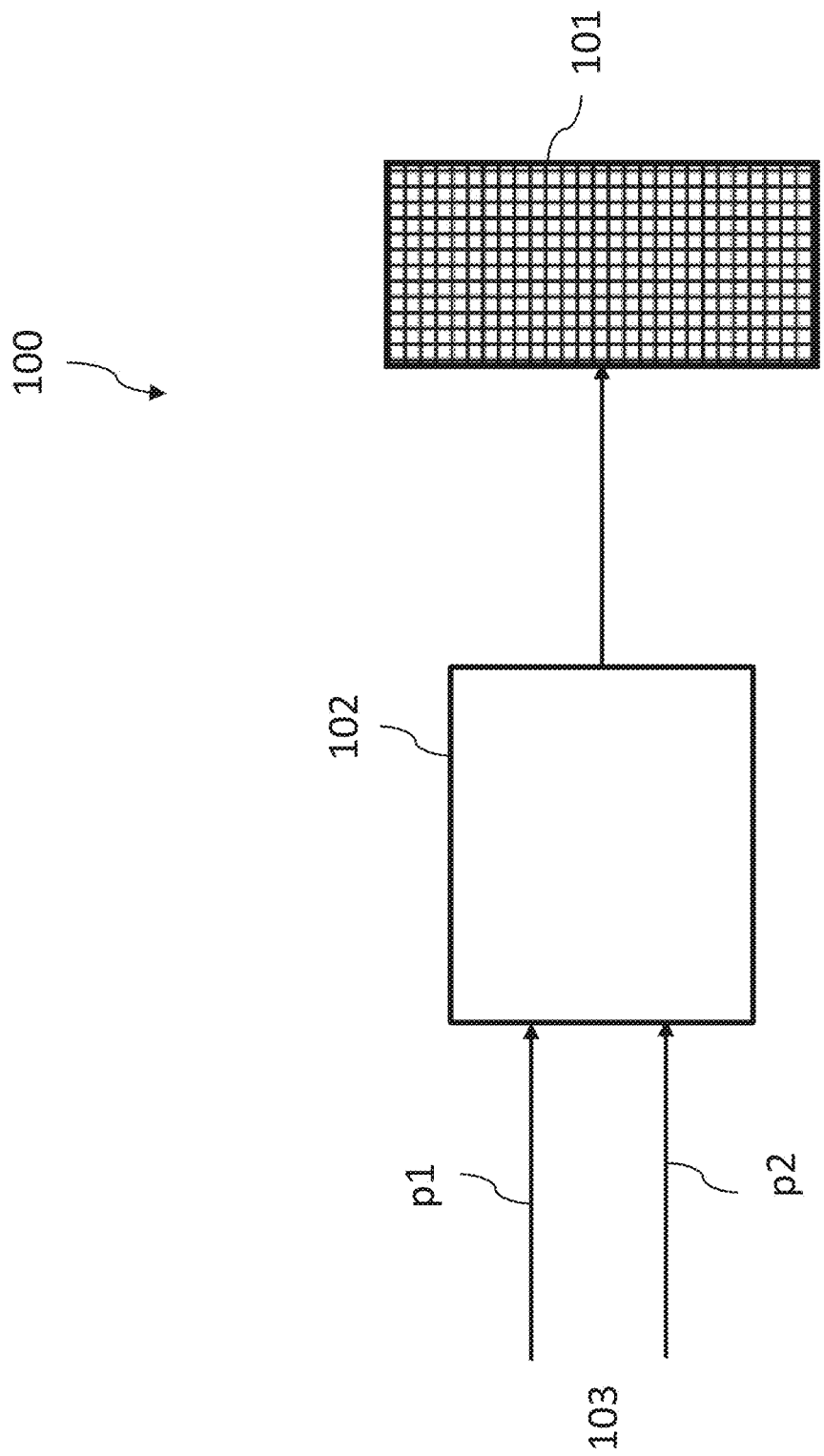
FIG. 1 shows a schematic illustration of a digital to analog converter circuit.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the following, various examples relate to devices (e.g. mobile device, cell phone, base station) or components (e.g. transmitter, transceiver) of devices used in wireless or mobile communications systems.

A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WI-MAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 shows a schematic illustration of a digital to analog converter circuit 100 according to an example. The digital to analog converter circuit 100 includes a plurality of digital to analog converter cells 101. The digital to analog converter circuit 100 further includes a control circuit 102 configured to control an operation of a digital to analog converter cell of the plurality of digital to analog converter cells 101 based on a first phase component, p1, of a digital signal 103 including information to be transmitted during a first time interval and based on a second phase component, p2, of the digital signal 103 including information to be transmitted during a second time interval.

Due to a digital to analog converter (DAC) cell of the plurality of DAC cells being configured to operate based on a first phase component during a first time interval and based on a second phase component during a second time interval, a single DAC cell may produce an analog cell output signal based on a plurality of different phase components of a digital signal, for example. In other words, a single DAC cell may be used commonly to produce an analog cell output signal based on a first phase component of the digital signal and second phase component of the digital signal, for example. Higher efficiency and smaller DAC area for the same resolution and improved linearity may be achieved, for example. For example, the minimum total size of the DAC circuit (e.g. the total number of DAC cells in a DAC array) may be reduced, for example.

Each digital to analog converter cell of the plurality of digital to analog converter cells 101 may be assigned to a cell row of a plurality of cell rows and a cell column of a plurality of cell columns, for example. For example, the DAC circuit 100 may include an array of cells. The plurality of digital to analog converter cells 101 may be arranged in a single array (e.g. a two-dimensional array), for example.

Each digital to analog converter cell of the plurality of digital to analog converter cells 101 may be activated or deactivated by a respective switching element (e.g. transistor) controlled by the control circuit 102 (e.g. a local activation control circuit of the control circuit). Further, each digital to analog converter cell of the plurality of digital to analog converter cells 101 may comprise a switchable current source or a switchable capacitive element or other kinds of unit elements to produce a cell analog output signal.

For example, the DAC circuit 100 may be configured to convert a multi-bit digital signal 103 to an analog signal, for example. The number of bits present in the multi-bit digital signal may correspond to a number of discrete values between which the analog signal varies, for example. The greater the number of bits present, the larger the number of discrete values for the analog signal. For example, for a 5 Volt (V) system, an eight bit digital signal may represent 256 (i.e., $2^8$) different voltage values; where voltage values range from a minimum of 0V to a maximum of 5V with 254 voltage steps in between. Each voltage step may be spaced at 5/255 V from neighboring voltage steps, for example. By varying the multi-bit input signal supplied to a DAC circuit, analog signals output by the DAC circuit may vary in a piecewise continuous manner, and are still referred to as analog signals because of their analog character. Analog signals as provided by a DAC circuit may be voltage signals, also referred to as signals in the voltage domain, or current signals, also referred to as signals in the current domain.

The DAC cells of the plurality of DAC cells 101 may each comprise a current source or a switchable capacitive element to produce a cell analog output signal having a first analog output state or a second analog output state, for example. For example, the plurality of DAC cells 101 within the array may each include respective current sources or capacitive elements that may be selectively triggered based on respective control signals from the control circuit 101 (e.g. a decoder circuit), for example. For example, the control signal may be based on the digital signal 103, such that the number of current sources that deliver current to an output terminal of the DAC circuit 100 may correspond to a digital value of the digital signal 103 at a given time. To limit glitches and other timing imperfections, the control circuit may modulate one or more of these control signals with a local oscillator signal LO received on an LO input terminal, for example.

The control circuit 102 may be configured to control an operation of each DAC cell of the plurality of digital to analog converter cells 101 based on the first phase component, p1, of the digital signal 103 and based on the second phase component, p2, of the digital signal 103, for example. In other words, the activation of at least one DAC cell of the plurality of digital to analog converter cells 101 depends on the first phase component, p1, of the digital signal 103 during the first time interval and depends on the second phase component, p2, of the digital signal 103 during the second time interval. The control circuit 102 may be configured to control an operation of the individual (or each) DAC cell of the plurality of DAC cells 101 by selectively triggering the respective current sources or capacitive elements based on a first phase component, p1, of a digital signal 103 during a first time interval, and based on a second phase component, p2, of the digital signal 103 during a second time interval, for example. In this way, the DAC circuit 100 and a DAC cell (e.g. an individual DAC cell of the DAC circuit) may be allocated to different phase component of a digital signal 103 during different time intervals.

The control circuit 102 may comprise circuitry configured to activate and deactivate each DAC cell of the plurality of digital to analog converter cells 101 individually.

The digital signal may be a complex valued signal within the baseband domain. The digital signal may comprise two phase components (e.g. in-phase component and quadrature phase component) or more than two phase components (multi-phase signal). For example, a baseband frequency of the baseband domain may be below 500 MHz (e.g. below 300 MHz or below 200 MHz, e.g. between 100 MHz and 200 MHz). In some examples, the digital signal may be a baseband signal. In some examples, the digital signal may be a baseband signal which has been upconverted or upsampled (e.g. to about 1.2 GHz), and/or filtered, for example. In some examples, the digital signal may be a transmit signal comprising information to be transmitted.

The digital signal may comprise different information to be transmitted during different time intervals. For example, the first time interval and the second time interval may be symbol time intervals used for transmitting different symbols. A symbol may relate to a constellation point in a constellation diagram (e.g. 16-QAM, 64-QAM) representing bit sequences to be transmitted.

The digital to analog converter circuit 100 may output an analog high frequency signal. For example, the digital to analog converter circuit 100 may provide an analog high frequency signal by summing analog cell output signals of the plurality of digital to analog converter cells. The analog high frequency signal may be a signal in the radio frequency domain with a frequency between 500 MHz and 20 GHz, for example. For example, radio frequency bands may be located between 700 MHz and 1 GHz, between 1.7 GHz and 1.9 Ghz and/or 2.5 GHz and 2.7 GHz.

The DAC cell may be configured to generate analog cell output signals during the first time interval and the second time interval. For example, a DAC cell may generate an analog cell output signal based on the first phase component, p1, of the digital signal 103 during the first time interval and may generate an analog cell output signal based on the second phase component, p2, of the digital signal 103 during the second time interval, for example.

An analog cell output signal generated during the first time interval may have an equal frequency and a predefined phase offset with respect to an analog cell output signal generated during the second time interval, for example. The DAC cell may be configured to generate the analog cell output signal based on a first oscillator signal during the first time interval and to generate the analog cell output signal based on a second oscillator signal during the second time interval, for example. The first oscillator signal and the second oscillator signal may have a predefine phase offset with respect to each other, for example.

For example, the DAC circuit 100 may be a thermometric coding-based digital to analog converter circuit. In this way, a very linear DAC may be provided. Alternatively, the DAC circuit 100 may be a binary coding-based digital to analog converter circuit.

For example, the DAC circuit shown in FIG. 1 may be a dynamic IQ architecture of DAC circuit that may outperform other IQ implementations in terms of higher efficiency and smaller DAC area for the same resolution and improved linearity. The dynamic IQ architecture may provide good efficiency, area and output power, and digital phase locked loop circuits DPLL or similar clock modulators which degrade the efficiency of polar systems or architectures may be avoided, for example.

Figure 2A:
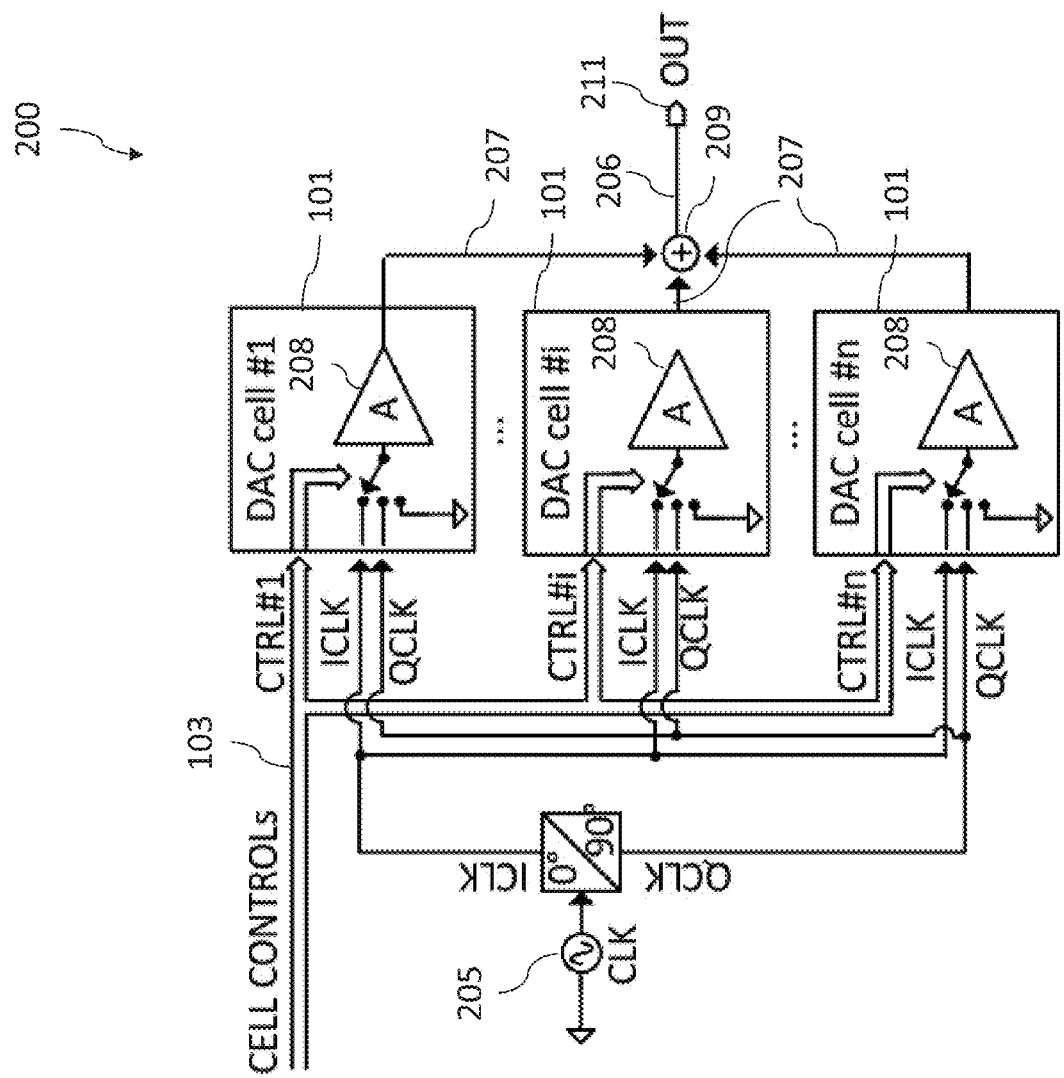
FIG. 2A shows a schematic illustration of a further digital to analog converter circuit.

FIG. 2A shows a schematic illustration of a digital to analog converter circuit 200 according to an example.

The DAC circuit 200 may be similar to the DAC circuit described above, e.g. with respect to FIG. 1, for example. The DAC circuit 200 may include a plurality of DAC cells 101 and a control circuit (or control circuitry) similar to the control circuit described with respect to FIG. 1, for example.

The DAC circuit 200 may be coupled to a baseband processor module configured to provide a digital signal 103 (e.g. a baseband signal) including or containing information to be transmitted to the DAC circuit 200 representing cell controls (e.g. CTRL#1, CTRL#i, CTRL#n). For example, the digital signal 103 may provide a first phase component of the digital signal and a second phase component of the digital signal to the plurality of DAC cells 101, for example. The first phase component of the digital signal and the second phase component of the digital signal may each include a least part of a multi-bit digital signal containing information to be transmitted, for example. For example, the first phase component of the digital signal may be an in phase component (I) of the digital signal and the second phase component of the digital signal may be a quadrature (Q) component of the digital signal, for example.

The control circuit of DAC circuit 200 may include an oscillator circuit 205 (e.g. a local oscillator or a clock CLK) configured to generate a first oscillator signal ICLK and a second oscillator signal QCLK. The first oscillator signal ICLK and the second oscillator signal QCLK may have a same frequency, for example. The frequency of the first oscillator signal ICLK and the second oscillator signal QCLK may represent a carrier frequency to be used to transmit the information to be transmitted. The first oscillator signal ICLK and the second oscillator signal QCLK may have a predefined phase offset, for example. For example, for transmitting an in phase component (I) of the digital signal and an quadrature (Q) component of the digital signal, the predefined phase offset of QCLK with respect to ICLK may be 90°, for example. In other examples, the predefined phase offset is not necessarily limited to 90°, but may be another predefined value, e.g. 30°, 45°, 60°, or 75°, for example. ICLK or QCLK may be fed to each DAC cell of a single RF-DAC, for example. For example, at least one of ICLK and QCLK may be fed to each DAC cell of a single RF-DAC, for example.

In this illustrated example, the schematic illustrations shows a conceptual block diagram of a dynamic IQ RFDAC where the I and Q signals may be provided to each cell of the DAC. For example, the two signals may be routed at LO frequency over the whole DAC array. The oscillator circuit 205 may be configured to provide the first oscillator signal (e.g. ICLK) and the second oscillator signal (e.g. QCLK) to each of the individual DAC cells of the plurality of DAC cells 101, for example. In other examples, only one of the I clock (e.g. ICLK) or the Q clock (e.g. QCLK) may be independently fed to each DAC cell of a single Dynamic RF-DAC.

The control circuitry may be configured to control an operation of the individual (or each) DAC cell of the plurality of DAC cells 101 by generating one or more control signals which may selectively trigger the respective current sources, capacitive elements or amplifiers 208 of the individual DAC cells to produce an analog cell output signal 207, for example. The control circuit of the DAC circuit may include or be coupled to a local activation control circuit, which may be located in each DAC cell, for example. For example, each DAC cell may include local activation control circuitry configured to control an activation of the DAC cell, for example. For example, the local activation control circuitry may be configured to trigger the respective current sources or capacitive elements of an individual DAC cell based on a first phase component of a digital signal 203 during a first time interval and based on a second phase component of the digital signal 203 during a second time interval, for example. Furthermore, the local activation control circuit may be configured to select the first oscillator signal (e.g. ICLK) during the first time interval and the second oscillator signal (e.g. QCLK) during the second time interval, for example.

Each DAC cell may be configured to generate an analog cell output signal 207. For example, during the first time interval, the analog cell output signal 207 may be based on the first phase component of the digital signal and the first oscillator signal. During the second time interval, the analog cell output signal 207 may be based on the second phase component of the digital signal and the second oscillator signal during the second time interval, for example. Optionally, the control circuitry may be configured to deactivate a DAC cell by connecting the oscillator signal input of the DAC cell or the local activation control circuit of the DAC cell to a constant reference potential (e.g. ground). A deactivated DAC cell does not contribute to an output signal of the DAC circuit, for example.

The DAC circuit 200 may include a summation circuit 209 for summing (or adding) analog cell output signals to obtain an analog high frequency signal, for example. The DAC circuit 200 may be configured to provide an analog high frequency signal 206 by summing analog cell output signals 207 of the plurality of digital to analog converter cells 101. The analog high frequency signal 206 may be output by the DAC circuit 200 at a DAC circuit output terminal 211, for example. The analog high frequency signal 206 may be amplified by a power amplifier to produce a high frequency transmit signal, which may be provided to an antenna module to be transmitted.

The most important performance metrics for DACs may include efficiency, area, resolution and linearity, for example. The DAC circuit 200 may improve efficiency, area and also linearity with the same resolution by combining two DACs in one single dynamic DAC, for example. The DAC circuit 200 may improve efficiency, area and also linearity with the same resolution.

The example described in FIG. 2a may be based on RF-DAC even though it may be applied to a baseband DAC as well, for example. For example, FIG. 2A shows a block diagram of a dynamic in-phase and quadrature radio frequency digital to analog converter circuit (IQ RF-DAC) implementation, e.g. a Dynamic IQ transmitter lineup.

Figure 2B:
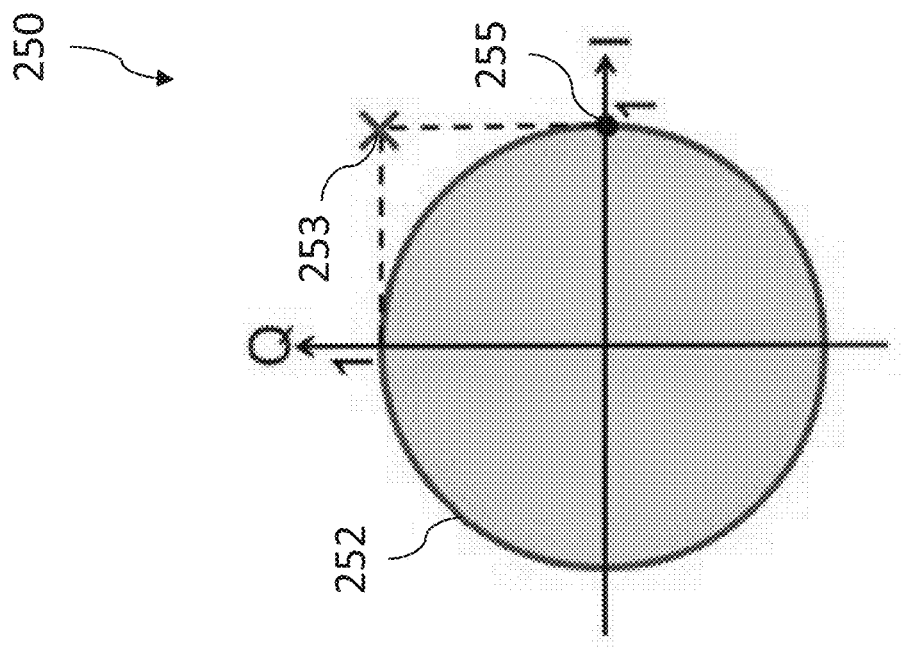
FIG. 2B shows a schematic illustration of a locus of normalized trajectories generated by digital to analog converter circuit.

FIG. 2B shows a schematic illustration 250 of the locus 252 of normalized useful trajectories generated by a dynamic RF-DAC, e.g. (DAC circuit 200). For example, dot 255 on the locus illustration shows a possible operating point within the locus 252 of trajectories, and cross 253 shows an example of an unused point.

In OFDM systems e.g., WiFi and LTE, symbols may be converted to trajectories by the front-end and then fed to the I and Q DACs. For example, all the trajectories for an OFDM system may lie within a circle 252 on the complex plane, thus no combination of I and Q signal points on the complex plane outside the circle 252 are ever used, for example. The OFDM modulation applied to the IQ symbols may randomize their phase before transmission, thus generating points on a circle, for example.

The DAC circuit 200 may be a dynamic RF DAC, for example, for a wireless local area network or Wi Fi signal (e.g. an 80 MHz 54 Mbps Wi Fi signal). A single dynamic RF-DAC may be able to take both I and Q signals at the input and directly generate an RF output by dynamically assigning the cells to I or Q phases according to needs, for example. The total number of cells of the dynamic RF-DAC may be chosen in order to cover only useful trajectories on a complex plane as shown in FIG. 2B, thus minimizing the cell overhead. As an example, point i=1, q=1 is not necessarily needed since it lies outside the circle, for example. The array can then be sized to have enough cells to cover $i=\sqrt{2}/2$, $q=i=\sqrt{2}/2$, and without extra cells, all the points lying within the circle 252 may be covered by dynamically redistributing a different clock to all the cells of the array, for example. The minimization of cell overhead may make the "dynamic RF-DAC" more efficient and smaller with respect to the conventional IQ TX Lineup, for example.

The DAC circuit 200 may combine two IQ DACs in a dynamic RF-DAC that is optimized to generate only useful trajectories such as the ones lying within the circle 252, for example. By avoiding the unused region of the complex plane outside the circle, higher efficiency and lower area occupation with respect to the other IQ arrangements may be reached, for example.

More details and aspects are mentioned in connection with the examples described above or below (e.g. the digital to analog converter circuit, the digital signal, the first phase component of the digital signal, the second phase component of the digital signal, the digital to analog converter cells, the control circuit, the transmitter, and the analog output signals). The examples shown in FIGS. 2A and 2B may comprise one or more optional additional features corresponding to one or more aspects mentioned in connection with the proposed concept or one or more examples described above (e.g. FIG. 1) or below (e.g. FIGS. 3A to 17).

Figure 3A:
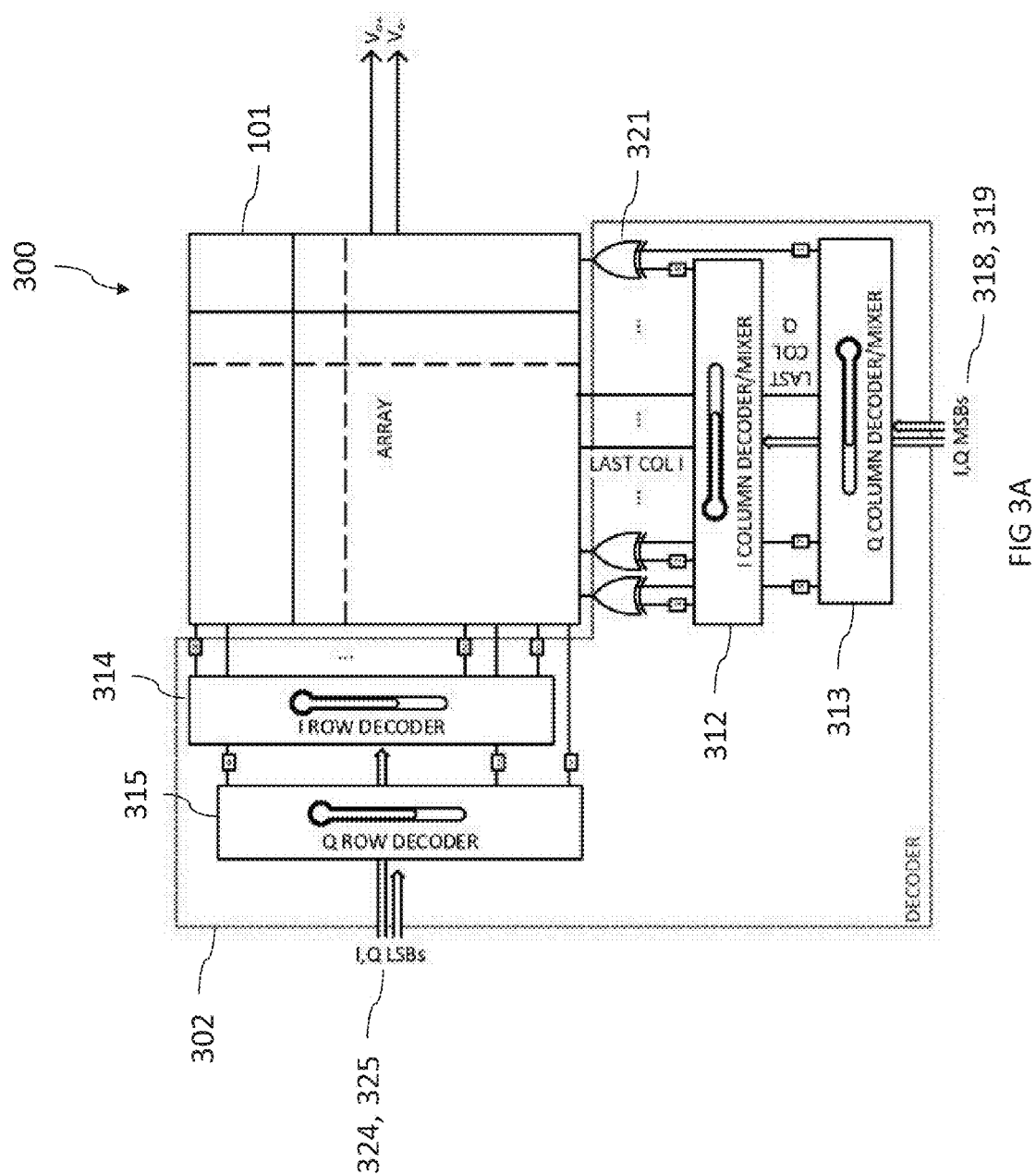
FIG. 3A shows a schematic illustration of a further digital to analog converter circuit.

FIG. 3A shows a digital to analog converter circuit 300 according to an example.

The DAC circuit 300 (e.g. a RFDAC) may be similar to the DAC circuits described above, e.g. with respect to FIGS. 1 and 2A, for example. For example, DAC circuit 300 may include a plurality of DAC cells 101. The DAC circuit 300 may be a thermometric coding-based DAC, for example. For example, the decoder control circuit may be configured to generate column codes and row codes based on thermometric coding for activating the DAC cells. For example, the DAC circuit 300 may be formed on a semiconductor chip and may include thermometric DAC arrays. The RFDAC may be arranged as a matrix of thermometric cells, for example.

The DAC circuit 300 may further include a control circuit 302 configured to control an operation of a DAC cell of the plurality of DAC cells based on a first phase component of a digital signal 103 containing information to be transmitted during a first time interval and based on a second phase component of the digital signal 103 containing information to be transmitted during a second time interval.

The control circuit 302 may include a decoder control circuit (e.g. a decoder), for example. The decoder control circuit may include a first column decoder circuit 312 and a second column decoder circuit 313, for example. The decoder control circuit may further include a first row decoder circuit 314 and a second row decoder circuit 315, for example.

The control circuit 302 of DAC circuit 300 may be configured to control a column operation mode of a column of digital to analog converter cells, for example. For example, the decoder control circuit may be configured to control the column operation mode of the column of digital to analog converter cells based on a first column code 316 (e.g. a thermometric code) derived from at least part of the first phase component of the digital signal and based on a second column code 317 (e.g. a thermometric code) derived from at least part of the second phase component of the digital signal.

The first column decoder circuit 312 may be configured to derive the first column code 316 based on at least part of the first phase component of the digital signal, for example. The second column decoder circuit 313 may be configured to derive the second column code 317 based on at least part of the second phase component of the digital signal, for example. The first column decoder circuit 312 may be configured to derive the first column code 316 based on most significant bits 318 of the first phase component of the digital signal, for example. The second column decoder circuit 313 may be configured to derive the second column code 317 based on most significant bits 319 of the second phase component of the digital signal, for example.

A local activation control circuit may be located in each DAC cell and may be configured to control an activation of the digital to analog converter cell based on the column operation mode, for example. For example, each DAC cell may have control signals determining whether the cell has to be turned ON or OFF by the local activation control circuit or local decoder, for example. The local activation control circuit may be configured to switch the DAC cell with a frequency of an oscillator signal if the digital to analog converter cell is activated.

For example, an oscillator signal may be dynamically selected in the column decoder of the array. Two column decoders may be employed. For example, an oscillator circuit may be coupled to the first column decoder circuit 312 and the second column decoder circuit 313. The first column decoder circuit 312 may be configured to control a selection of a first oscillator signal provided by the oscillator circuit, for example. The second column decoder 313 may be configured to control a selection of a second oscillator signal provided by the oscillator circuit, for example. The column decoder on top (e.g. the first column decoder circuit 312) may be responsible for the I clock, while the column decoder on the bottom (e.g. the second column decoder 313) for the Q clock, for example.

Based on the first column code (e.g. thermometer coded representation or binary coded representation of a predefined number of most significant bits of the first phase component) and second column code (e.g. thermometer coded representation or binary coded representation of a predefined number of most significant bits of the second phase component) provided by the first and second column decoder circuits 312, 313, a column operation mode for each respective column of the array may be identified. The first oscillator signal or a second oscillator signal may be multiplexed to the respective column based on the identified column operation mode, for example. For example, the oscillator circuit may be configured to provide the first oscillator signal to a column of digital to analog converter cells operating in a first column operation mode and the second oscillator signal to a column of digital to analog converter cells operating in a second column operation mode. The oscillator circuit may be configured to provide the first oscillator signal to a DAC cell of the plurality of DAC cells 101 during the first time interval and the second oscillator signal to the DAC cell during the second time interval, for example. For example, only one of the first oscillator signal and the second oscillator signal may be routed to each column during one time interval. For example, each column may be designated as one of an I or Q column during one time interval. For example, each column decoder (e.g. the first and second column decoder circuits 312, 313) may provide its clock (either I or Q) only for the active column. The designation may be implemented, for example by one or more digital gates, for example. For example, the decoder control circuit may include an XOR gate 321 (or OR gate or AND gate) associated with a cell column of a plurality of cell columns. The XOR gate 321 (or OR gate or AND gate) may be coupled to the first column decoder circuit 312 and the second column decoder circuit 313, for example. The XOR or OR or AND gate 321 may be configured to output a column control signal which indicates a column as an I or Q column based on the first column code or the second column code, for example. For example, an output signal of the XOR gate or OR gate or AND gate may indicate a column operation mode of the cell column.

For example, the first column decoder circuit 312 may convert a predefined number N of most significant bits of the first phase component to predefined number M of thermometric coded bits. The first column decoder may further provide a clock signal to each column of cells. The first column decoder provides a clock signal only for the active columns; it does not provide any clock to the inactive columns. The clock provided by the first column decoder may be the I clock (ICLK), for example. Further, the second column decoder circuits 313 may convert a predefined number N of most significant bits of the second phase component to predefined number M of thermometric coded bits. The second column decoder may further provide a clock signal to each column of cells. The second column decoder provides a clock signal only for the active columns; it does not provide any clock to the inactive columns. The clock provided by the second column decoder may be the Q clock (QCLK), for example. Further, the clock signal of each column of cells may be generated by using an XOR gate 321 receiving one clock signal from the first column decoder 312 and one clock signal from the second column decoder 313, for example. For example, the clock of the last column of cells may be generated by using an XOR gate receiving the last clock (M-th clock) provided by the first column decoder circuits 312 at the first input of the XOR and the first clock provided by the second column decoder circuits 313 at the second input of the XOR.

For example, FIG. 3A may show an implementation of a dynamic DAC as an array of thermometer coded cells and clock multiplexing. For example, the I and Q clocks may be multiplexed in the column decoder and only one clock signal per column may be fed to the array. For example, as the oscillator signals (e.g. the I and Q clocks) may be multiplexed in the column decoder (e.g. first column decoder circuit 312 and the second column decoder circuit 313) and only one clock signal per column may be fed to the array, instead of both I and Q clocks being fed to each cell, routing two signals at LO frequency over the whole DAC array (as shown in FIG. 2A) may be avoided, for example. Due to the dynamic reconfiguration of the clock implemented in the decoder, only one high-frequency clock line per column may be fed to the array, for example.

Figure 3B:
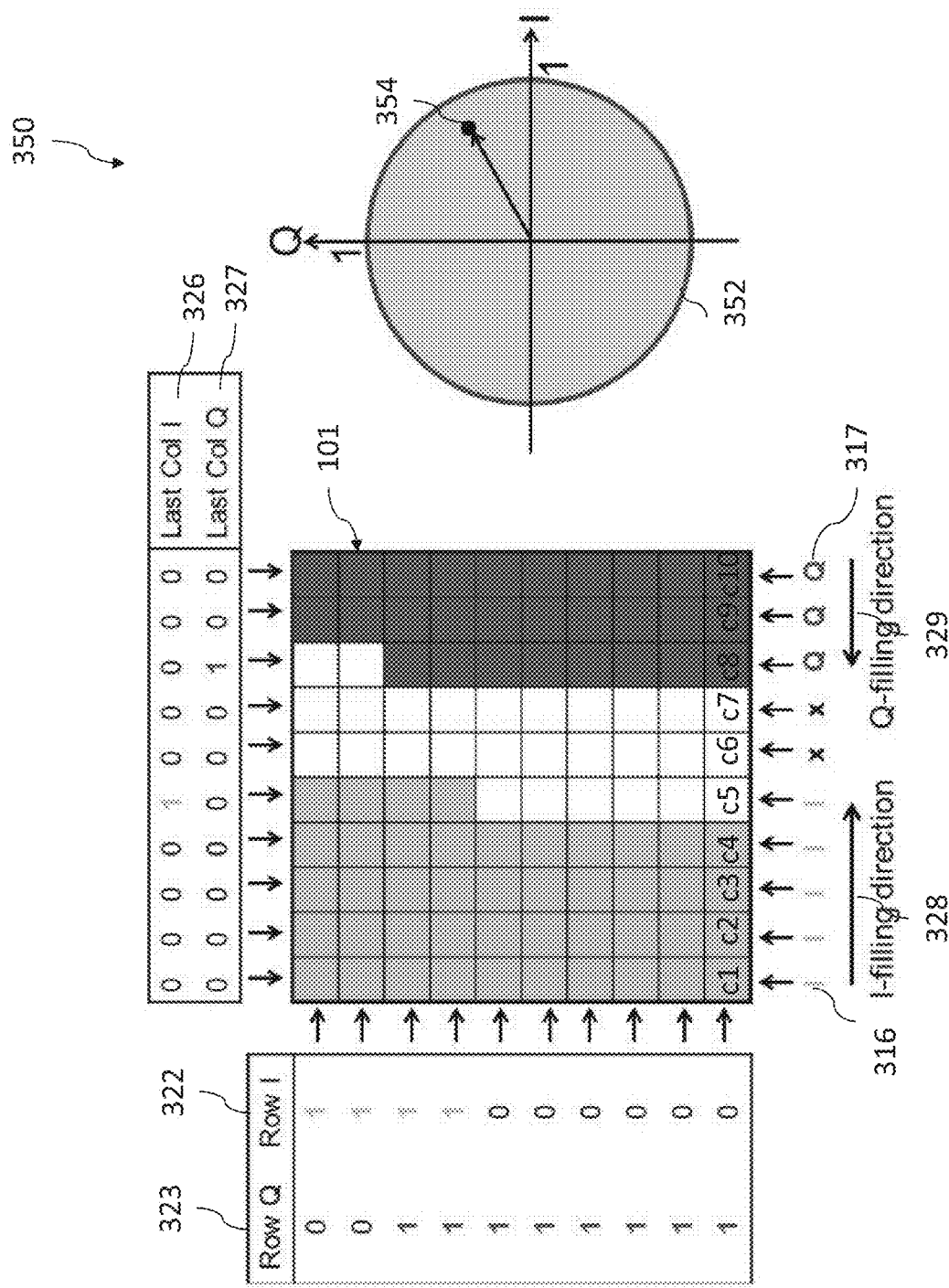
FIG. 3B shows a schematic illustration of an array subdivision and input data of a digital to analog converter circuit.

FIG. 3B shows a schematic illustration of an array subdivision 350 and input data of a digital to analog converter circuit according to an example. For example, the input data (e.g. the signals) may be provided or fed to the array for a use case.

The local activation control circuit located in the DAC cell may be configured to control an activation of a DAC converter cell in a column of DAC cells. For example, the local activation control circuit located in the DAC cell may be configured to control an activation of the DAC cell based on the column operation mode, for example. For example, all DAC cells in a column e.g. may operate in the same operation mode.

The first column decoder circuit 312 may be configured to provide the first column code from a first predefined starting column in the array in a predefined first filling direction 328, for example. The second column decoder circuit 312 may be configured to provide the second column code from a second predefined starting column in the array in a predefined second filling direction 329, for example. For example, the decoder on top (e.g. the first column decoder 312) may turn on I columns from the left to the right, while the decoder on the bottom (e.g. the second column decoder 313) may turn on Q columns from the right to the left. The array may be implemented by thermometric cells and partially filled by I clocked cells (left to right) and Q clocked cells (right to left) as for the point 354 located within the locus of trajectories 352, for example.

The activation of the DAC cell may depend on an identification of a last column. Except for an identified last column of DAC cells operating in a respective operation mode (e.g. c5 and c8), all DAC cells in each previous (non-last) column (e.g. c1 to c4 and c9 to c10) may be activated, for example. The local activation control circuit located in the DAC cells in non-last columns may be configured to switch on all DAC cells within the column, for example. In other words, the local activation control circuit located in the DAC cells in the previous columns may be configured to control an activation of the digital to analog converter cell based on the column operation mode without consideration of a first row code or a second row code, for example.

For the last columns (e.g. c5 and c8), the cells have to be turned on individually, for example. The decoder control circuit may be configured to provide a last column signal 326 (e.g. Last Col I) indicating a last column c5 of digital to analog converter cells operating in a first column operation mode and a last column signal 327 (e.g. Last Col Q) indicating a last column c8 of digital to analog converter cells operating in a second operation mode, for example.

The local activation control circuit may be configured to control an activation of a digital to analog converter cell in a last column based on (or by considering) the column code and at least one of a first row code 322 and a second row code 323. For example, for a last column c5 of DAC cells operating in a first column operation mode, the local activation control circuit may consider the first column code 316 and a first row code 322. For example, for a last column c8 of DAC cells operating in a second column operation mode, the local activation control circuit may consider the second column code 317 and a second row code 323.

The first row decoder circuit 314 may be configured to derive the first row code 322 based on at least part of the first phase component of the digital signal, for example. The second row decoder circuit may be configured to derive a second row code 323 based on at least part of the second phase component of the digital signal, for example. For example, the first row decoder circuit 314 may be configured to derive the first row code 322 based on least significant bits 324 of the first phase component of the digital signal. The second row decoder circuit 315 may be configured to derive the second column code 323 based on least significant bits 325 of the second phase component of the digital signal.

For the last I and last Q columns, the cells may be turned on individually to ensure the I and Q granularity, for example. The "Last Col I" and "Last Col Q" signals may be active for the last column of the I and Q regions. When "Last Col I" (or "Last Col Q") is active for a column, then the cells may be active if the "Row I" ("Row Q") signal is active; otherwise the cell is off. The "Row I" and "Row Q" signals are generated by two independent row decoders defining the granularity of I and Q regions. The output lines of the two row decoders may be routed over the whole array, for example.

Higher efficiency and smaller DAC area for the same resolution and improved linearity may be achieved, for example. For example, the minimum total size of the DAC circuit (e.g. the total number of DAC cells in a DAC array) may be reduced, for example. Furthermore, as the oscillator signals may be multiplexed in the decoder circuit, only one clock signal per column may be provided to the array instead of multiple clocks being provided to each cell, thus reducing the complexity of the circuit, for example.

For example, all signals coming from the left side and from the top may be low frequency signals which may change at the baseband data rate. On the other hand, the I and Q clocks may be high frequency signals. Since the selection among I and Q clocks may be made in the column decoder, only one high frequency clock signal is routed to a whole column of cells, for example. Therefore, only one clock line is needed for each cell, therefore avoiding the routing of double clock lines compared to the DAC circuit described in FIG. 2A. Due to the compact layout, the DAC circuit 300 may have an even smaller area, matching between array cells may be improved resulting in improved overall linearity.

The DAC circuit 300 may include at least one inactive column (e.g. c6, c7) of digital to analog converter cells located between the last column of digital to analog converter cells operating in the first column operation mode and the last column of digital to analog converter cells operating in the second column operation mode. For example, the sizing of the array may ensure that there is always a column of separation between I phased array region and Q phased array region then, only one among I and Q clocks can be active on a single column, for example. Therefore, the output of the two column decoders can be combined column-wise through the XOR or an OR gate, for example. Then only one among I and Q clocks is provided to a column, for example.

More details and aspects are mentioned in connection with the examples described above or below (e.g. the digital to analog converter circuit, the digital signal, the first phase component of the digital signal, the second phase component of the digital signal, the digital to analog converter cells, the control circuit, the row and column decoders, the first and second column codes and the first and second row codes, the transmitter, and the analog output signals). The examples shown in FIGS. 3A and 3B may comprise one or more optional additional features corresponding to one or more aspects mentioned in connection with the proposed concept or one or more examples described above (e.g. FIGS. 1 to 2B) or below (e.g. FIGS. 4 to 17).

Figure 4:
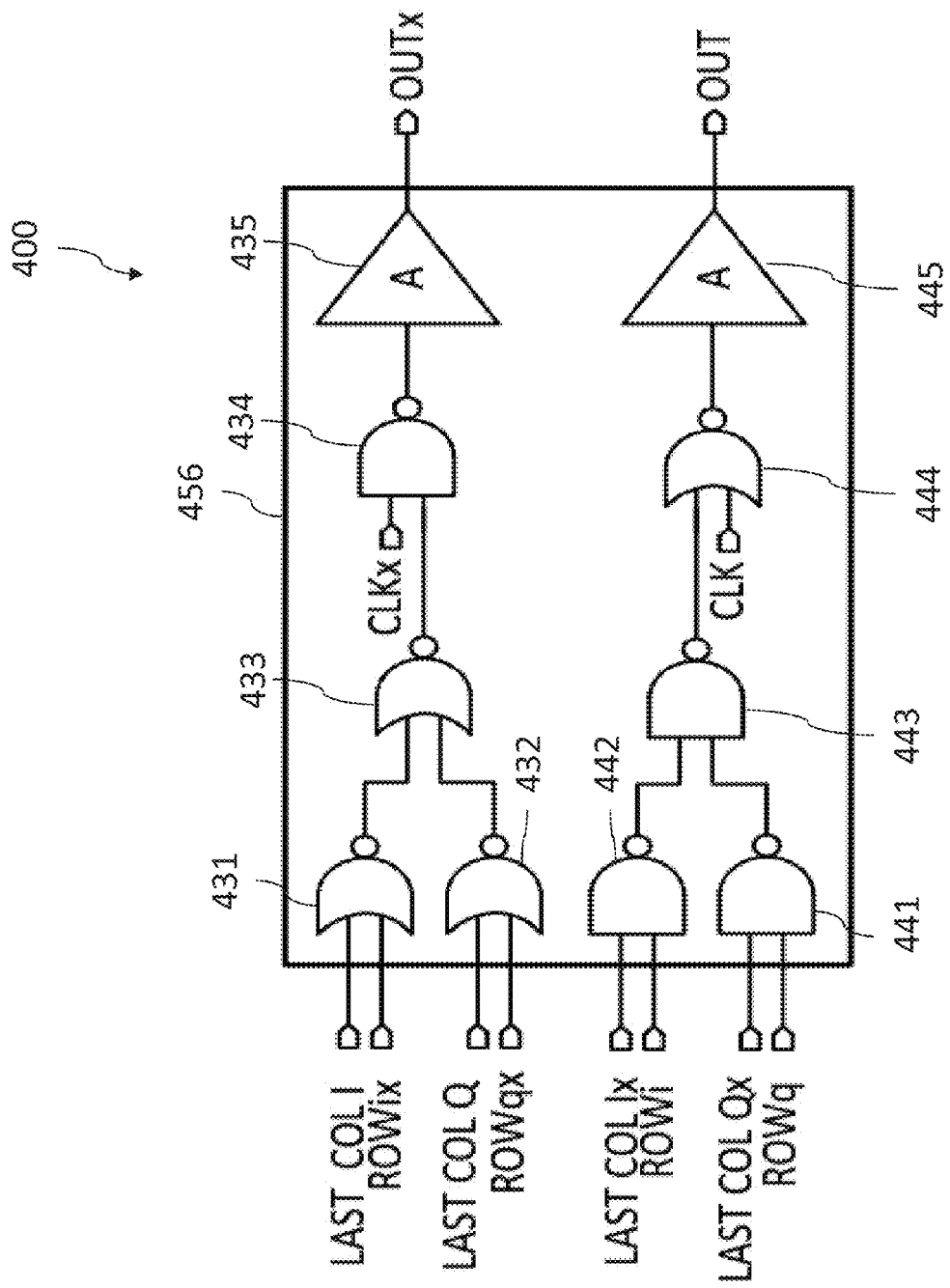
FIG. 4 shows a schematic illustration of a local activation circuit of a digital to analog converter circuit.

FIG. 4 shows a schematic illustration of a local activation circuit 456 of a digital to analog converter circuit 400 according to an example.

The local decoder logic of the local activation control circuit 456 may be simple and small. For example, the high frequency clock may be gated by a NAND or NOR gate. The local activation control circuit 456 may be configured to output a pair of differential signals (e.g. OUTx and OUT, or e.g. Vo+ and Vo− shown in FIG. 3A). The first output signal OUTx may be based on a first pair of input signals (e.g. LAST COL I and ROWix) an a second pair of input signals (e.g. LAST COL Q and ROWqx), for example. The second output signals OUT may be based on a further first pair of input signals (e.g. LAST COL Ix and RowI) and a further second pair of input signals (e.g. LAST COL Qx and ROWq), for example.

The signal LAST COL I may be a last column signal indicating a last column designated to operate in a first column mode (e.g. as an I column), for example. The signal LAST COL Q may be a last column signal indicating a last column designated to operate in a second column mode (e.g. as a Q column), for example. The signal ROWi may be based on the first row code, for example. The signal ROWq may be based on the second row code, for example. The signal OUT may be based on an analog cell output signal, for example. The signals LAST COL Ix, LAST COL Qx, ROWix, ROWqx and OUTx may represent the complement of the signals LAST COL I, LAST COL Q, ROWi, ROWq and OUT, respectively.

For example, the local activation control circuit 456 may include a first NOR gate 431 and a second NOR gate 432, for example. The first NOR gate 431 may be configured to receive a LAST COL I signal at its first input terminal and a ROWix signal at its second input terminal, for example.

The second NOR gate 432 may be configured to receive a LAST COL Q signal at its first input terminal and a ROWqx signal at its second input terminal, for example. The local activation control circuit 456 may further include a third NOR gate 433. The third NOR gate 433 may be configured to receive an output signal from the first NOR gate 431 at its first input terminal and an output signal from the second NOR gate 432 at its second input terminal, for example. The local activation control circuit 456 may further include a NAND gate 434. The NAND gate 434 may be configured to receive an output signal from the third NOR gate 433 at its first input terminal and to receive a clock signal CLKx at its second input terminal, for example. The local activation control circuit 456 may further include a DAC unitary element 435, for example. The DAC unitary element 435 may be a current source or voltage source or capacitor, for example, configured to receive an output signal from the NAND gate 434 and to output a high frequency analog output signal OUTx at its output terminal, for example.

Additionally or alternatively, the local activation control circuit 456 may include a first NAND gate 441 and a second NAND gate 442, for example. The first NAND gate 441 may be configured to receive a LAST COL Ix signal at its first input terminal and a ROWi signal at its second input terminal, for example. The second NAND gate 442 may be configured to receive a LAST COL Qx signal at its first input terminal and a ROWq signal at its second input terminal, for example. The local activation control circuit 456 may further include a third NAND gate 443, for example. The third NAND gate 443 may be configured to receive an output signal from the first NAND gate 441 at its first input terminal and an output signal from the second NAND gate 442 at its second input terminal, for example. The local activation control circuit 456 may further include a NOR gate 444, for example. The NOR gate 444 may be configured to receive an output signal from the third NAND gate 443 at its first input terminal and to receive a clock signal CLK at its second input terminal, for example. The local activation control circuit 456 may further include a DAC unitary element 445, for example. The DAC unitary element 445 may be a current source or voltage source or capacitor, for example, configured to receive an output signal from the NOR gate 444 and to output a high frequency analog output signal OUT at its output terminal, for example.

For example, FIG. 4 shows a thermometer cell of the dynamic DAC circuit 400 including a local activation control circuit 456 or local decoder. The local activation control circuit 456 may be a local decoder of a DAC differential cell used in current DACs (I-DACs) and/or capacitive DACs (C-DACs), for example. The DAC circuit 400 may be similar to the DAC circuits described above, e.g. with respect to FIGS. 1 to 3B, for example.

More details and aspects are mentioned in connection with the examples described above or below (e.g. the digital to analog converter circuit, the local activation circuit, the digital signal, the first phase component of the digital signal, the second phase component of the digital signal, the digital to analog converter cells, the control circuit, the row and column decoders, the first and second column codes and the first and second row codes, the transmitter, and the analog output signals). The examples shown in FIG. 4 may comprise one or more optional additional features corresponding to one or more aspects mentioned in connection with the proposed concept or one or more examples described above (e.g. FIGS. 1 to 3B) or below (e.g. FIGS. 5 to 17).

Figure 5:
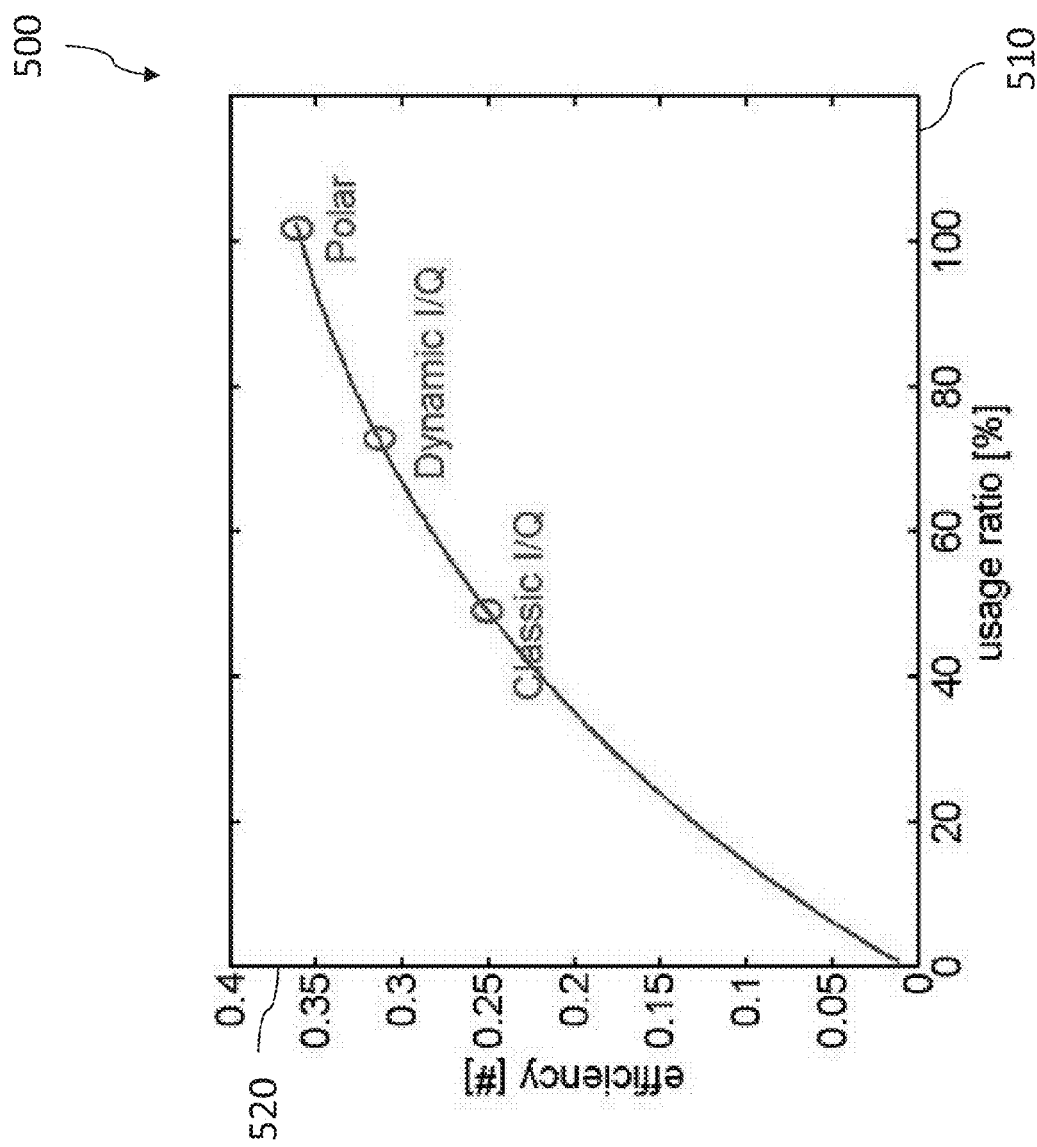
FIG. 5 shows a plot of a digital to analog converter efficiency curve.

FIG. 5 shows a plot 500 of a digital to analog converter efficiency curve according to an example. For example, FIG.

5 shows an RF-DAC efficiency curve for a RF-DAC with 1024 cells, (circuit transient simulations at nominal corner and) T=27° for example.

Usage ratio may be defined as the number of used cells over number of total DAC cells. The efficiency of the RF-DAC converters may be at a maximum if all cells are used i.e., usage ratio=1 or 100%, and then decreases for lower codes due to the increase of OFF unused cells.

The plot 500 shows a plot of usage ratio 510 on the x-axis and overall efficiency 520 on the y-axis. Taking the efficiency curve as a reference, a single operating point e.g., i=1, q=0 (dot 255 in FIG. 2B) may be considered.

Using a classic IQ DAC, (where the DAC is split in two blocks, e.g. 512 cells for I and 512 cells for Q) the I DAC is fully ON while the Q DAC is totally OFF i.e., only half of the cells are turned ON, while half of the cells are OFF, for example. A DAC usage ratio of 50% may be achieved, for example.

For the dynamic IQ DAC (e.g. the DAC circuits described herein according to various examples), the DAC is used for $(1/\sqrt{2}) \times 1024$ cells, while the remaining $(\sqrt{2} - 1/\sqrt{2}) \times 1024$ cells are OFF. A DAC usage ratio of 70% may be achieved, for example.

In polar DAC architecture, all cells are on and therefore a DAC usage ratio of 100% may result, for example. The polar DAC however needs a phase modulated clock, for example. The power loss in this signal generation has a negative impact on the efficiency of the overall system, for example. For the same operating point, the efficiency of the dynamic IQ is improved compared to the efficiency of the classic IQ, and approaches the efficiency of a polar DAC, without the need for a phase modulated clock, for example.

Different IQ transmitter implementations may have different DAC size and coverage of possible trajectories, for the same peak output power. For example, classic IQ implementations may have the largest area occupation and therefore present the worst efficiency. The DAC circuits according to various examples implementation takes 30% less area than the classic IQ, thus improving the efficiency compared to the classic IQ implementation. Polar takes 50% less area than the Classic IQ but needs a digital PLL or equivalent to operate (since it needs a phase modulated clock), which degrades the transmitter efficiency.

For example, in order to generate any trajectory within a circle in the complex plane with ray=1 in terms of output voltage/current (as shown in FIG. 2B), the exact amount of necessary cells for the dynamic IQ array may be calculated as follows:

Let i be the in-phase component of the complex output signal to be transmitted and q be the quadrature-phase component of the complex output signal to be transmitted, then in order to generate all points within the circle, the equation of the circle has to hold, for example.

$$i^2 + q^2 < 1 \quad \text{(Eq.1)}$$

Let the maximum output produced by an array of size $s_a$ be a, for example. The dynamic IQ circuit may cover each point where i+q<a, where $s_a$ is the size of the dynamic array. In order to fulfill Eq. 1 it may be necessary to cover all points on the perimeter of the circle.

$$i = \sin(\theta)$$

$$q = \cos(\theta)$$

where $\theta \in [0°:90°]$.

Having a single reconfigurable array, in this particular case it may be necessary that $i+q=\sin(\theta)+\cos(\theta)<a$, for example.

The maximum of $\sin(\theta)+\cos(\theta)$ occurs at $\theta=45°$, and at this point, $\sin(45°)+\cos(45°)=\sqrt{2}$, for example.

Let the size of array $s_a$ be directly proportional to a, with proportionality constant being 1, for the sake of simplicity. Thus the minimum total dynamic IQ size $s_a=\sqrt{2}$, for example. Therefore, a size of a single dynamic array may be $\sqrt{2}$, for example.

The same analysis can be done for an IQ array and for a Polar array. The analysis gives that size of the classic IQ array has to be 2, for example, and size of the Polar array has to be 1, for example, for the same output power. The DAC area among different IQ transmitter implementations for the same output power may be compared. The size of the DAC array described in the examples herein is reduced from 2 to $\sqrt{2}$ in comparison to a classic IQ with a single I array and a single Q array, for example. In comparison, polar architecture may have an array size of 1, for example, but may require a clock modulator, for example.

More details and aspects are mentioned in connection with the examples described above or below (e.g. the digital to analog converter circuit, the digital signal, the first phase component of the digital signal, the second phase component of the digital signal, the digital to analog converter cells, the control circuit, the row and column decoders, the first and second column codes and the first and second row codes, the transmitter, and the analog output signals). The examples shown in FIG. 5 may comprise one or more optional additional features corresponding to one or more aspects mentioned in connection with the proposed concept or one or more examples described above (e.g. FIGS. 1 to 4) or below (e.g. FIGS. 6 to 17).

Figure 6:
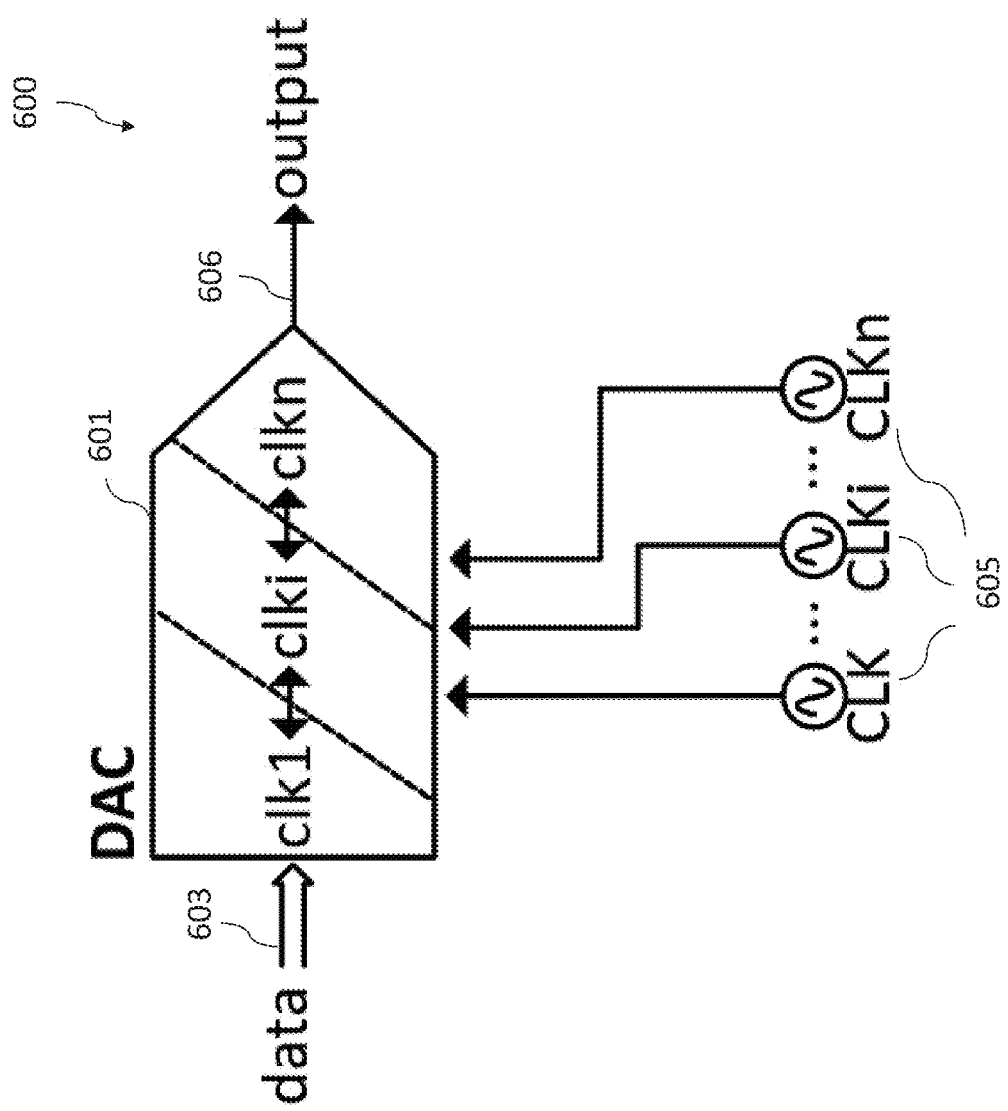
FIG. 6 shows a schematic illustration of a further digital to analog converter circuit.

FIG. 6 shows an example of a digital to analog converter circuit 600 according to an example. The DAC circuit 600 may be similar to the DAC circuits described above, e.g. with respect to FIGS. 1 to 5, for example.

The DAC circuit 600 may include a multi-phased single array digital to analog converter circuit. The DAC circuit 600 may also include an oscillator circuit 605 configured to generate a plurality of clock signals (e.g CLK CLKi, CLKn), for example. For example, a single DAC cell may be used to receive multiple phase components, and to produce analog output signals 606 based on the multiple phase components mixed with a plurality of different clock phases, for example.

For example, the DAC circuit 600 may include a plurality of DAC cells, e.g. a DAC cell array 601. The DAC circuit 600 may further include a control circuit configured to control an operation of a DAC cell of the plurality of DAC cells 601 based on one or more phase components of a digital signal 603 containing information to be transmitted. The one or more phase components may be based on different phase offsets of a digital signal. For example, besides or in addition to in-phase and quadrature-phase signals, other phase components may be received (e.g. 0°, 90°, 180°, 270°) for example. Each DAC cell may receive one or more different phase components of the digital signal 603 during different time intervals.

The DAC circuit 600 may apply to oversampled DACs, for example. When multiple DACs running at different adjacent phases are used, then the increased number of DACs pays off with an increased sampling frequency of the system, for example. This is the concept of interleaved DACs. For example, the dynamic RF-DAC implementation may be generalized to a single DAC where multiple phases may be dynamically fed in to its cells without the need for building a separate DAC for each phase which has to be interpolated. Once a number of phases (n) are available, a DAC operating at n times its sampling frequency may be built due to oversampling, for example. By using the dynamic DAC circuit, the hassles of building n arrays may be avoided since one single dynamic array may be sufficient, for example.

More details and aspects are mentioned in connection with the examples described above or below (e.g. the digital to analog converter circuit, the local activation circuit, the digital signal, the first phase component of the digital signal, the second phase component of the digital signal, the digital to analog converter cells, the control circuit, the row and column decoders, the first and second column codes and the first and second row codes, the transmitter, and the analog output signals). The examples shown in FIG. 6 may comprise one or more optional additional features corresponding to one or more aspects mentioned in connection with the proposed concept or one or more examples described above (e.g. FIGS. 1 to 5) or below (e.g. FIGS. 6 to 17).

Figure 7:
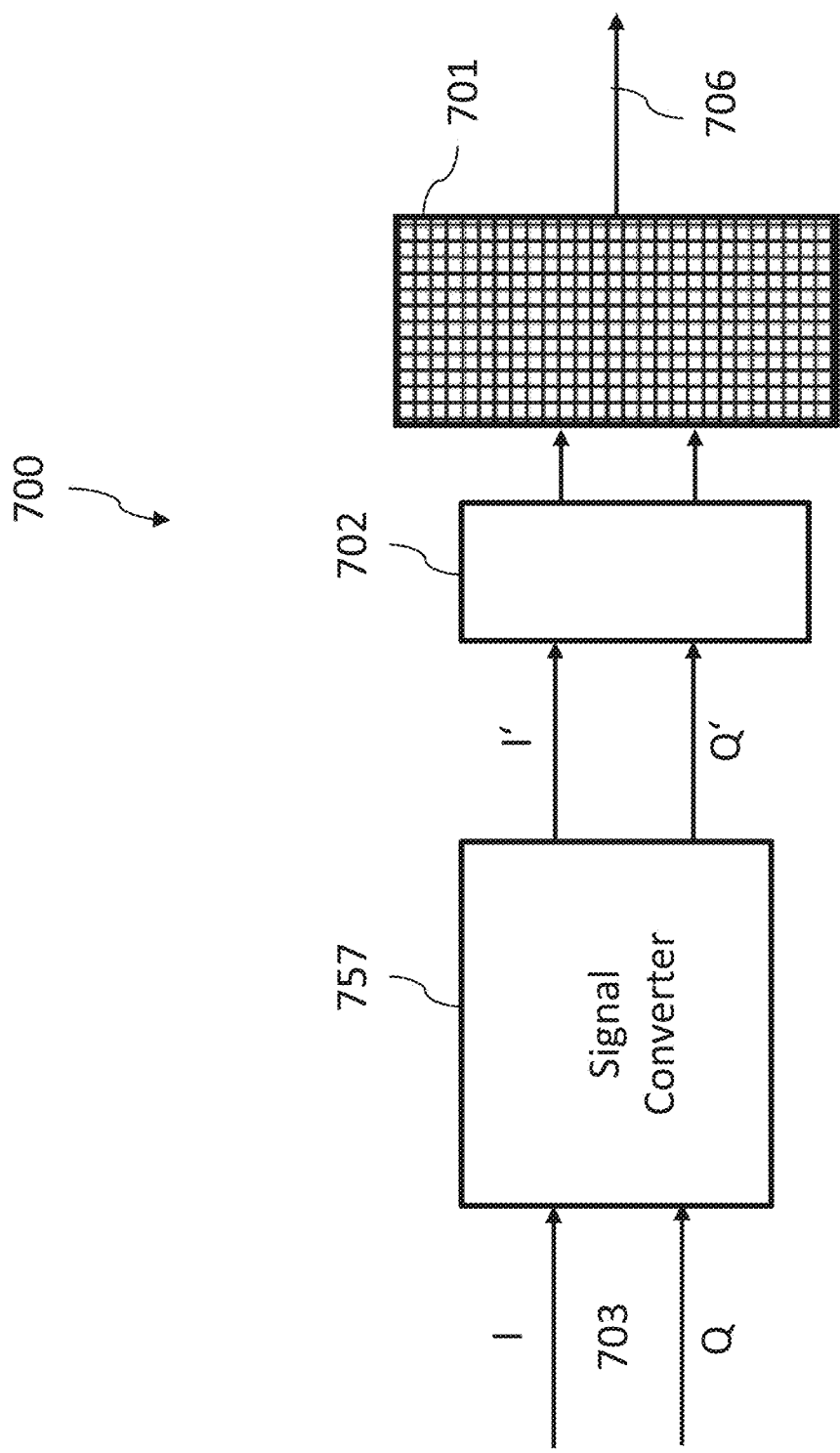
FIG. 7 shows a schematic illustration of an apparatus for generating a high frequency transmission signal.

FIG. 7 shows an apparatus 700 for generating a high frequency transmission signal according to an example.

The apparatus 700 may include a plurality of digital to analog converter cells 701. The apparatus 700 may further include a signal converter 757 configured to generate a first adapted phase component (e.g. I') and a second adapted phase component (e.g. Q') of a digital signal 703 containing information to be transmitted derivable by a rotation transformation of a first (e.g. I) and a second (e.g. Q) input phase component of the digital signal 703. The apparatus 700 may further include an up conversion module 702 configured to generate a high frequency transmission signal based on the first adapted phase component and the second adapted phase component of the digital signal.

Due to the implementation of an apparatus which generates a high frequency transmission signal based on the first adapted phase component and the second adapted phase component of the digital signal derivable from a rotation transformation, output power may be increased (e.g. doubled) assuming the same silicon area and with much efficiency. For example, all cells may be used for generating the output of the DAC circuit so that the number of unused cells may be reduced, for example.

The up conversion module 702 may include a DAC circuit similar to the DAC circuits described above, e.g. with respect to FIGS. 1 to 6, for example. For example, the up conversion module 702 may include an IQ DAC circuit, which may be built so that the cells may (each) be activated as an I or Q cell. Pre-processing of the digital data may be carried out by a rotation of 45 degrees, for example. A first adapted phase component (e.g. I') and a second adapted phase component (e.g. Q') may be produced, where I and Q are the first input phase component and the second input phase component of the digital signal, respectively, for example. The first adapted phase component (e.g. I') and the second adapted phase component (e.g. Q') may be produced based on an adaptation or a rotation of a constellation diagram by a predefined rotation offset, for example. The original constellation diagram may be a constellation diagram representing the phase and amplitude of the first (e.g. I) and a second (e.g. Q) input phase components of the digital signal 703, for example.

The first adapted phase component and the second adapted phase component may be related to the first input phase component and the second input phase component according to the following relationship:

$I'=I+Q$ and $Q'=-I+Q$. For example, the signal converter 757 may be configured to generate the first adapted phase component (e.g. I') and the second adapted phase component (e.g. Q') of the digital signal 703 containing information to be transmitted based on (or by performing) a rotation transformation of the first (e.g. I) and the second (e.g. Q) input phase component of the digital signal 703, respectively.

Furthermore, correction of the digital data for the correct value may be carried out if a negative value is generated, for example. Furthermore, correction of the digital data for a time delay between I and Q may be carried out, for example. A line and column decoder may be used for generating the proper signals for the cells, for example.

More details and aspects are mentioned in connection with the examples described above or below (e.g. the digital to analog converter circuit, the signal converter, the local activation circuit, the digital signal, the first phase component of the digital signal, the second phase component of the digital signal, the digital to analog converter cells, the control circuit, the row and column decoders, the first and second column codes and the first and second row codes, the transmitter, and the analog output signals). The examples shown in FIG. 7 may comprise one or more optional additional features corresponding to one or more aspects mentioned in connection with the proposed concept or one or more examples described above (e.g. FIGS. 1 to 6) or below (e.g. FIGS. 8A to 17).

Figure 8B:
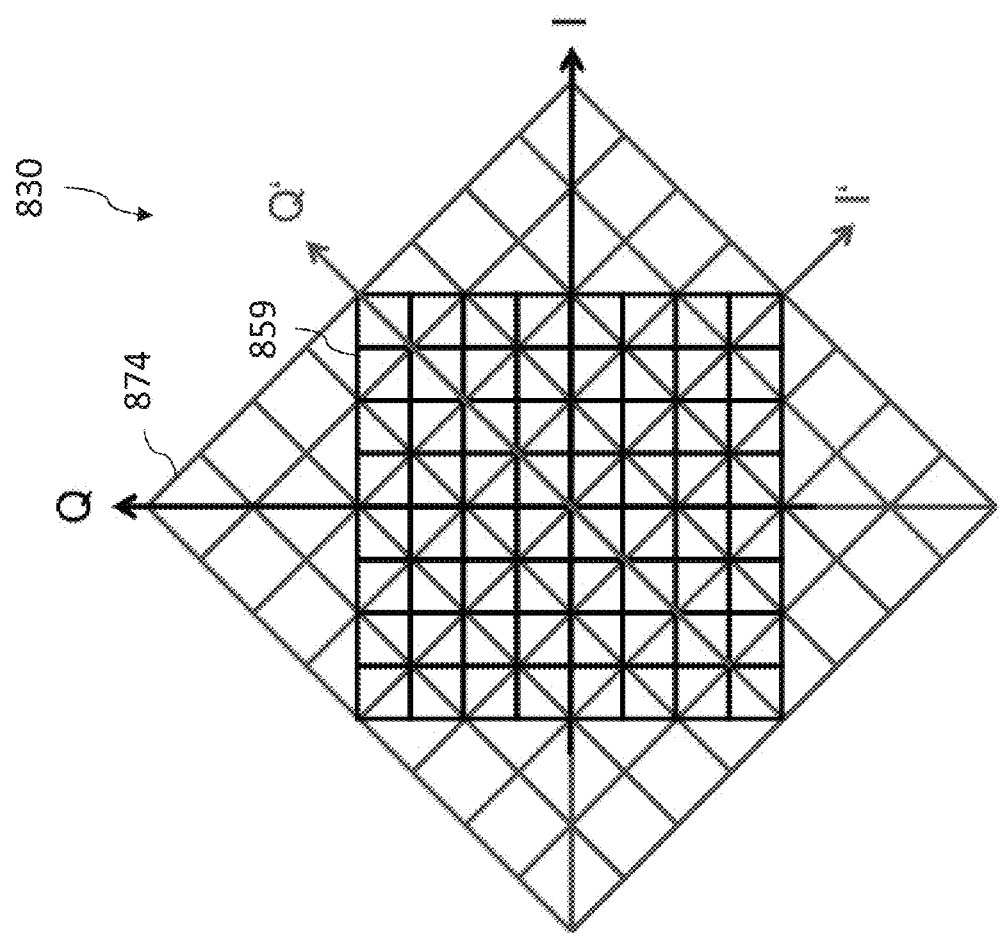
Figure 8C:
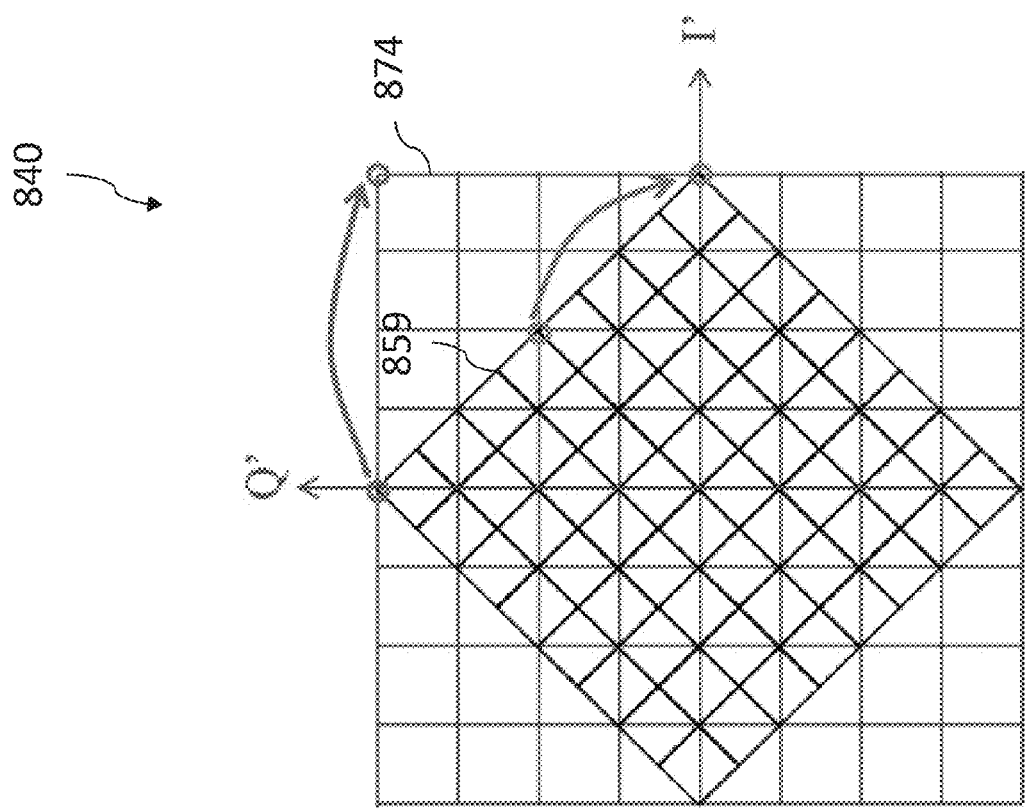

FIGS. 8A to 8C shows how a first adapted phase component and a second adapted phase component derivable by a rotation transform may be used to increase range and output power, for example.

FIG. 8A shows a schematic illustration of increasing output power for an IQ DAC according to an example.

The IQ constellation diagram 810 may be the original constellation diagram, for example. The IQ constellation diagram 820 shows the increased range (as shown in the increased range from constellation diagram 859 to constellation diagram 861) which may be achieved by reusing DACs, for example. For example, all cells may be used for generating the output with IQ DACs. The output power may be increased if the I and the Q DAC may be built in such a way that unused cells may also generate the signal of the other DAC. For example, the output power for I may be doubled if a Q DAC (e.g. cells used only for Q signals) may also deliver an I signal However, the output power may be generated where it is not needed. In order for the output power to be generated where it is needed, the constellation diagram may be rotated by 45 degrees, for example.

FIG. 8B shows a schematic illustration of a rotation constellation diagram 830 according to an example.

Mathematically a rotation may be carried out by the equations:

$x'=x\cos\phi+y\sin\phi$ and $y'=-x\sin\phi+y\cos\phi$

For a 45 degree shift this may be simplified to:

$I'=0.707(I+Q)$ and $Q'=0.707(-I+Q)$

The gain may be corrected to increase power from the original constellation square 859 to the new constellation square 874, so that $I'=I+Q$ and $Q'=-I+Q$ The gain correction may be carried out by a conversion correction circuit, for example.

By doing this all signals may be transmitted with a 45 degree shift, for example. This constant phase shift is allowed, as it may have the same effect as changing the distance between transmitter and receiver by $\lambda/8$, for example.

Such a rotation transformation may be carried out by the signal converter 757, for example. The rotation transformation described herein is not to be regarded as a rotation in a polar diagram, or a conversion from IQ to polar, for example.

FIG. 8C shows a schematic illustration of a constellation diagram 840 according to an example.

After the rotation, the range of the original input values may fit exactly to the new DAC, for example. Assuming a 10 bit DAC (the input values of I and Q are 0 to 1023 each), the following values may be obtained.

| I | Q | φ | I' | Q' |
| --- | --- | --- | --- | --- |
| 1023 | 0 | 0 | 1023 | −1023 |
| 1023 | 1023 | 45 | 2046 | 0 |
| 0 | 1023 | 90 | 1023 | 1023 |
| −1023 | 1023 | 135 | 0 | 2046 |

The calculation I'=I+Q and Q'=−I+Q may be relatively simple. Afterwards the data may be corrected for the correct strobe point if negative values are generated by inversion of the local oscillator (LO), for example. This correction may be done by a switchable all pass filter or by an interpolator which calculates ¼ from one sample and ¾ of the next sample if the sign is negative, and ½ from both samples if the sign is positive More details and aspects are mentioned in connection with the examples described above or below (e.g. the digital to analog converter circuit, the local activation circuit, the digital signal, the first phase component of the digital signal, the second phase component of the digital signal, the digital to analog converter cells, the control circuit, the row and column decoders, the first and second column codes and the first and second row codes, the transmitter, and the analog output signals). The examples shown in FIG. 8 may comprise one or more optional additional features corresponding to one or more aspects mentioned in connection with the proposed concept or one or more examples described above (e.g. FIGS. 1 to 7) or below (e.g. FIGS. 9 to 17).

Additionally or alternatively, any one of the DAC circuits previously described (e.g. 100, 200, 300, 400, 600, 700) may further include a signal converter circuit configured to generate a first adapted phase component and a second adapted phase component of a digital signal containing information to be transmitted derivable by a rotation transformation of a first and a second input phase component of a digital signal, for example. The digital to analog converter cell may be configured to generate an analog cell output signal based on the first adapted phase component during the first time interval and based on the second adapted phase component during the second time interval, for example. Such a signal converter is further described with respect to further examples below.

Figure 9:
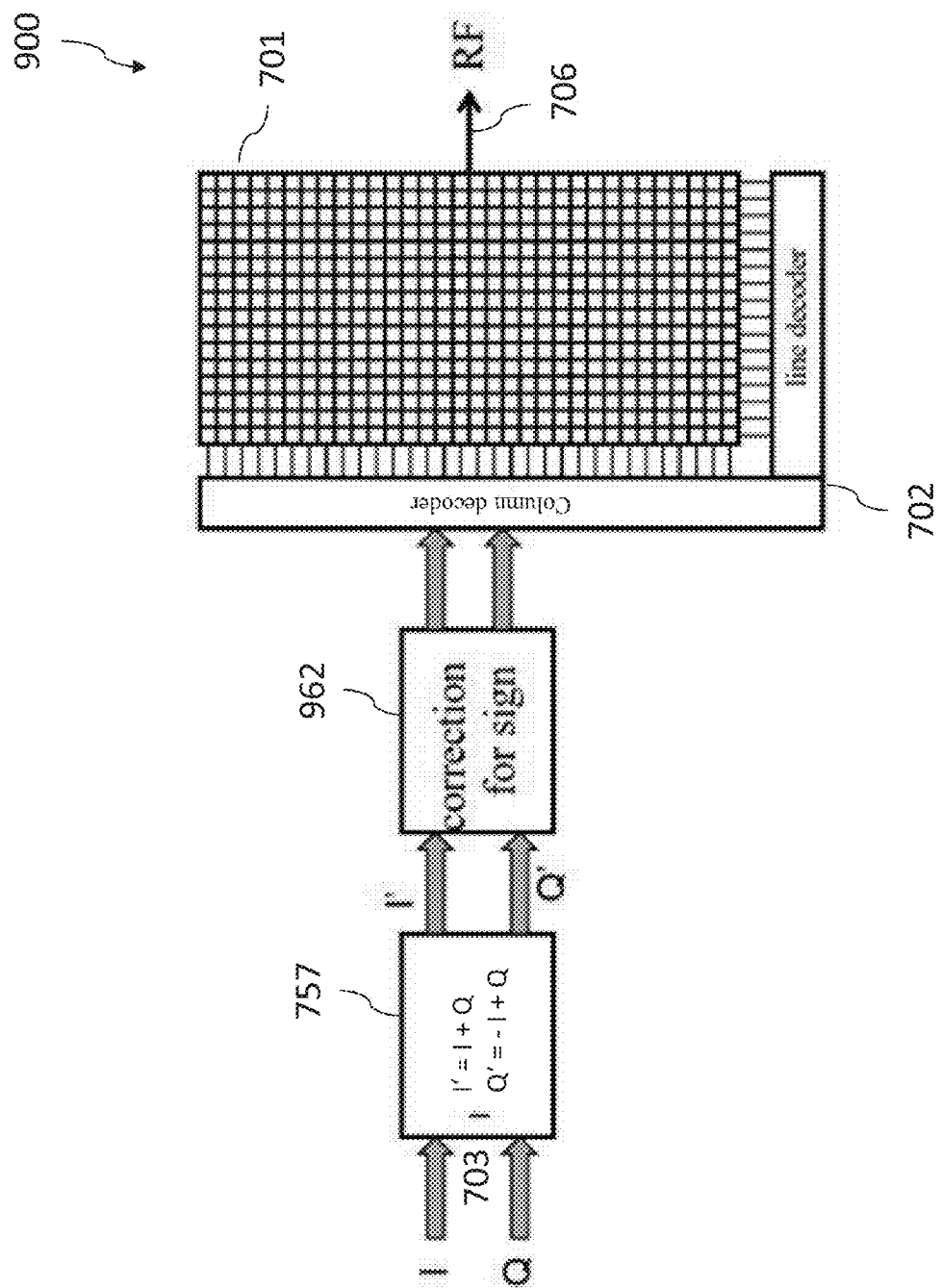
FIG. 9 shows a schematic illustration of a further apparatus for generating a high frequency transmission signal.

FIG. 9 shows a schematic illustration of a further apparatus 900 for generating a high frequency transmission signal according to an example. The apparatus 900 may be similar to the apparatus described above, e.g. with respect to FIG. 7, for example.

Similarly to the apparatus described with respect to FIG. 7, apparatus 900 may include a signal converter 757 and an up conversion module 702. For example, the apparatus 900 may include a control circuit including a decoder control circuit configured to control a column operation mode of a column of digital to analog converter cells. for generating the proper signals for the cells. The up conversion module may include an RFDAC with improved efficiency and output power, for example.

The apparatus 900 may include a conversion correction circuit 962 configured to correct a sign error of at least one of the first adapted phase component I' and the second adapted phase component Q' based on a value of the first adapted phase component and the second adapted phase component, for example.

For example, the conversion correction circuit 962 may be configured to provide a correction of the digital data for the correct value if a negative value is generated. For example, the conversion correction circuit 962 may be configured to provide a correction of the digital data for the time delay between I and Q. For example, the conversion correction circuit 962 may be configured to correct the data for the correct strobe point if negative values are generated by inversion of the local oscillator (LO), for example. For example, the conversion correction circuit 962 may include a switchable all pass filter or an interpolator configured to calculate ¼ from the first adapted phase component and ¾ of the second adapted phase component if the sign is negative, and ½ from both adapted phase components if the sign is positive, for example.

The apparatus 900 including the up conversion module (e.g. including a DAC circuit) may deliver up to twice the output power assuming the same silicon area and with much higher efficiency. Efficiency may be improved because with a DAC circuit without adapted phase components, a 0° or 90° degree output signal is generated and only one of the DACs may generate an output signal, for example. By summing up the output signals power is wasted by charge redistribution. With a DAC circuit similar to previous examples implemented in the apparatus 900, the whole capacitor network may generate the 0° or 90° degree output signal, for example.

More details and aspects are mentioned in connection with the examples described above or below (e.g. the digital to analog converter circuit, the signal converter, the conversion correction circuit, the local activation circuit, the digital signal, the first phase component of the digital signal, the second phase component of the digital signal, the digital to analog converter cells, the control circuit, the row and column decoders, the first and second column codes and the first and second row codes, the transmitter, and the analog output signals). The examples shown in FIG. 9 may comprise one or more optional additional features corresponding to one or more aspects mentioned in connection with the proposed concept or one or more examples described above (e.g. FIGS. 1 to 8) or below (e.g. FIGS. 10 to 17).

The examples described herein, refer to rows and columns of an array, each with corresponding row decoder circuits and column decoder circuits. It may be understood that in alternative examples, the features described with respect to the columns and column decoder circuits may be implemented in rows and row decoders, and conversely, the features described with respect to and related to rows and row decoders may be implemented in column and column decoders, for example. For example, the features described with respect to rows and columns may be switched with each other.

Figure 10:
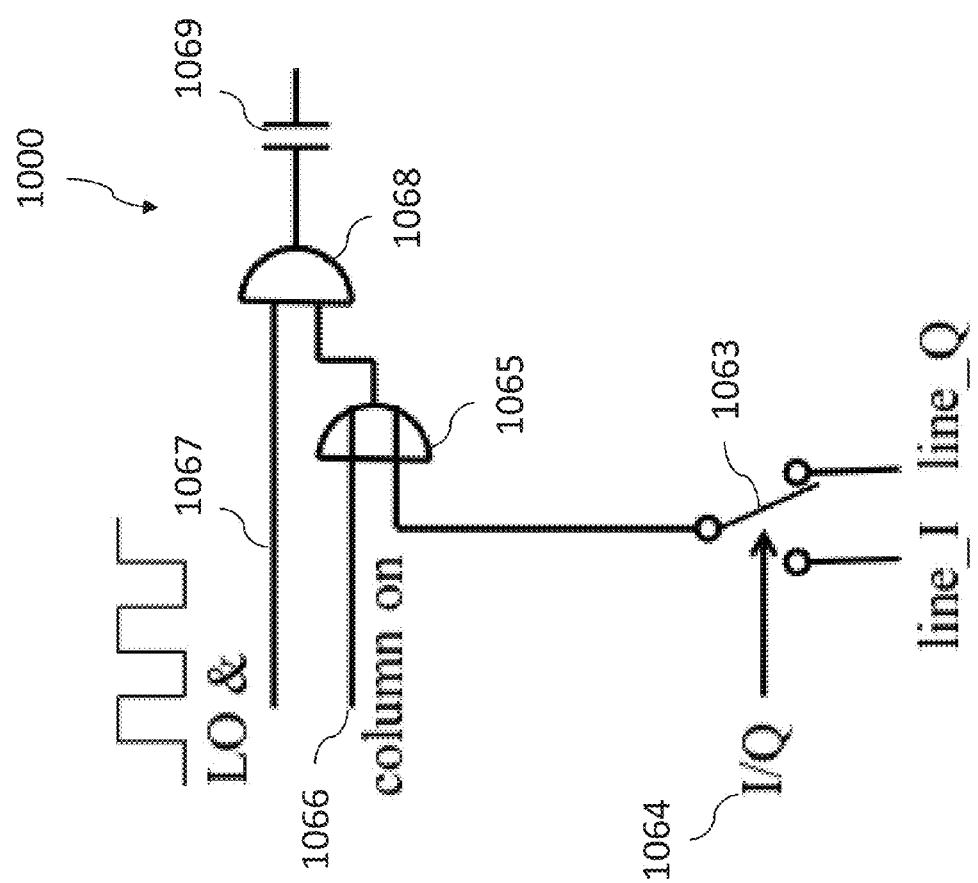
FIG. 10 shows a schematic illustration of a local activation circuit of a digital to analog converter circuit.

For example, in alternative examples, the row (or line) control signals may be modulated with the LO signal, rather than the column control signals. For example, in alternative arrangements, the LO signal may be provided to a row (or line) decoder such that at least one row (or line) thermometer control signal is LO modulated. For example, in other alternative arrangements a row operation mode may be determined instead of or in addition to a column operation mode, for example. These alternative arrangements apply to examples described above and below. FIG. 10 shows such an example.

FIG. 10 shows a schematic illustration of a local activation circuit of a digital to analog converter circuit 1000 according to an example. The DAC circuit 1000 may be similar to the DAC circuits described above, e.g. with respect to FIGS. 1 to 9, for example For example, the DAC circuit 1000 may include a thermometer or thermometric coded DAC circuit. In some examples, each cell in the thermometer coded DAC may include at least 5 connections to a line (or row) and a column decoder, for example.

The DAC circuit 1000 may be a control circuit of a DAC cell, for example. The control circuit of the DAC cell 1000 may include a selection circuit 1063 configured to switch the DAC cell between the operation modes e.g. between a first operation mode (for I) and a second operation mode (for Q), based on a signal IQ 1064, for example. The selection circuit 1063 may be located in a local activation circuit of a DAC cell, for example. The information from the line (line_I or line_Q) may be logical 'OR' combined with the column on information signal 1066 by at least one OR gate 1065 coupled to the selection circuit 1063, for example. If the output signal of the at least one OR gate 1065 is "1", the cell may be activated, for example. The output signal of the at least one OR gate 1065 may be "AND" combined with an oscillator signal 1067 corresponding to the operation mode selected by the selection circuit 1063 (e.g. an I clock or a Q clock), by at least one AND gate 1068, for example. The AND gate 1068, the OR gate 1065 and the selection circuit 1063 may be located in a local activation circuit of a DAC cell, for example. The DAC cell may include a switchable current source or a switchable capacitive element 1069 configured to produce an analog output signal (e.g. a current signal) based on the information from the line, for example.

Switching the cells between I and Q functionality may be carried out for a complete line (or row), for example. For example, one signal may be IQ telling the cell if it is working as I or Q cell. With this information the cell selects the information from the line (or row) decoder, for example. The resulting line information may be logical 'or' combined with the column on information. If the output of this OR is "1" the cell is activated, for example. This activation signal may be logical "AND" combined with the LO and column signal, for example. This LO may be the clock signal for I modulation or the 90 degree shifted clock for Q, for example.

The complexity of the DAC cell may be higher than the complexity of the cell of the separated I and Q DACs, and the decoders and the logic in the signal path may be more complex. However, the new DAC may deliver twice the output power with much higher efficiency, for example.

More details and aspects are mentioned in connection with the examples described above or below (e.g. the digital to analog converter circuit, the local activation circuit, the digital signal, the first phase component of the digital signal, the second phase component of the digital signal, the digital to analog converter cells, the control circuit, the row and column decoders, the first and second column codes and the first and second row codes, the transmitter, and the analog output signals). The examples shown in FIG. 10 may comprise one or more optional additional features corresponding to one or more aspects mentioned in connection with the proposed concept or one or more examples described above (e.g. FIGS. 1 to 9) or below (e.g. FIGS. 11 to 17).

Figure 11:
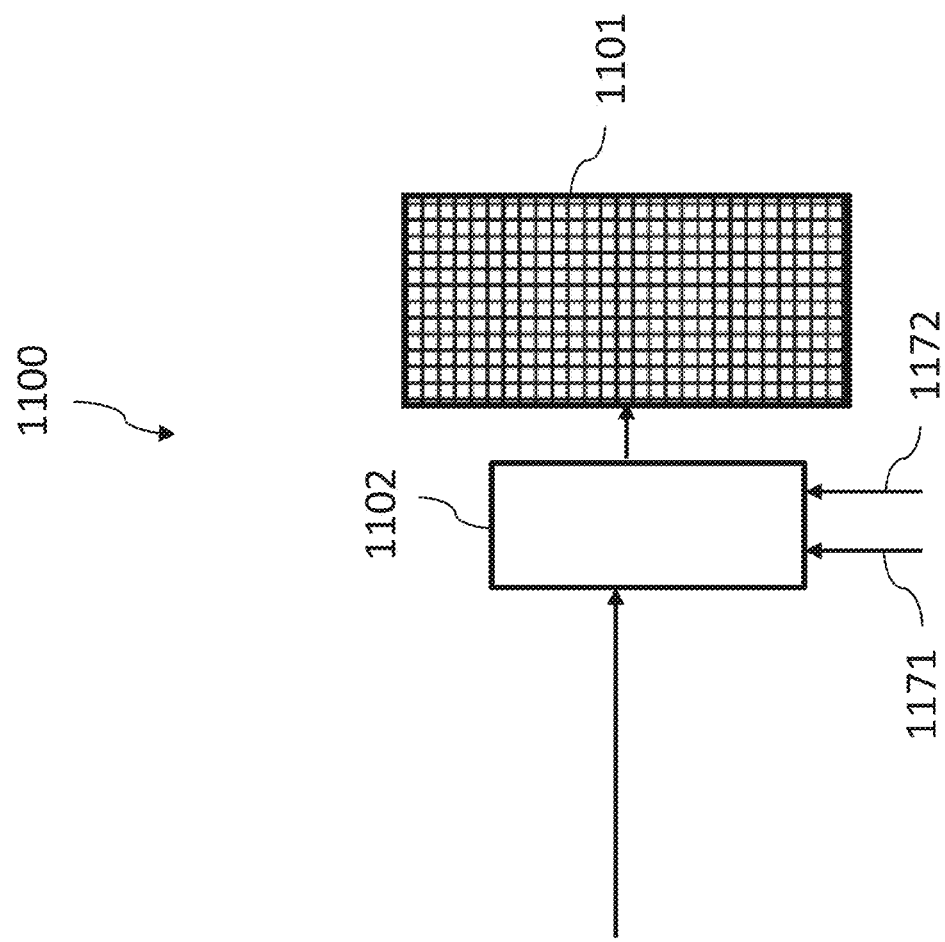
FIG. 11 shows a schematic illustration of a further digital to analog converter circuit.

FIG. 11 shows a schematic illustration of a further digital to analog converter circuit 1100 according to an example.

The digital to analog converter circuit 1100 may include a plurality of digital to analog converter cells 1101. The digital to analog converter circuit 1100 may further include a control circuit 1102 configured to control an operation of a digital to analog converter cell of the plurality of digital to analog converter cells 1101 based on a first clock signal 1171 having a first oscillation frequency during a first time interval and based on a second clock signal 1172 having a second oscillation frequency during a second time interval.

As the digital to analog converter (DAC) cell may be configured to operate based on first clock signal having a first oscillation frequency during a first time interval and based on a second clock signal having a second oscillation frequency during a second time interval, a single DAC cell may receive multiple oscillation frequencies of a local oscillator signal, for example. a digital signal, for example. Higher efficiency and smaller DAC area for the same resolution and improved linearity may be achieved, for example.

The control circuit 1102 may be configured to control the operation of a digital to analog converter cell based on the same phase component of a digital signal containing information to be transmitted during the first time interval and the second time interval. For example, a DAC cell may be configured to provide an analog output signal based on the same phase component of the digital signal during the first time interval and the second time interval. However, the analog output signal may be based on the first clock signal having the first oscillation frequency during the first time interval and based on the second clock signal having the second oscillation frequency during the second time interval, for example.

In an example, the DAC circuit 1100 may be configured to provide an analog high frequency signal based on two or more phase components of a digital signal containing information to be transmitted. For example, the DAC circuit 1100 may include a first plurality of DAC cells and a second plurality of DAC cells. For example, the first plurality of DAC cells may be configured to receive a first phase component of a digital signal and the second plurality of DAC cells may be configured to receive a second phase component of digital signal. The first plurality of DAC cells and the second plurality of DAC cells may each be configured to receive a plurality of clock signals having different clock frequencies, and to produce the analog output signal based on the clock signals having different clock frequencies, for example.

In an example, the plurality of clock signals received by the first plurality of DAC cells may have the same frequencies as a plurality of clock signals received by the second plurality of DAC cells.

In another example, the plurality of clock signals received by the first plurality of DAC cells may have different frequencies compared to the plurality of clock signals received by the second plurality of DAC cells.

More details and aspects are mentioned in connection with the examples described above or below (e.g. the digital to analog converter circuit, the local activation circuit, the digital signal, (e.g. the digital signal, phase components of the digital signal, the digital to analog converter cells, the first and second clock signals, the control circuit, the row and column decoders, the first and second column codes and the first and second row codes, the transmitter, and the analog output signals). The examples shown in FIG. 11 may comprise one or more optional additional features corresponding to one or more aspects mentioned in connection with the proposed concept or one or more examples described above (e.g. FIGS. 1 to 10) or below (e.g. FIGS. 12 to 17).

Figure 12:
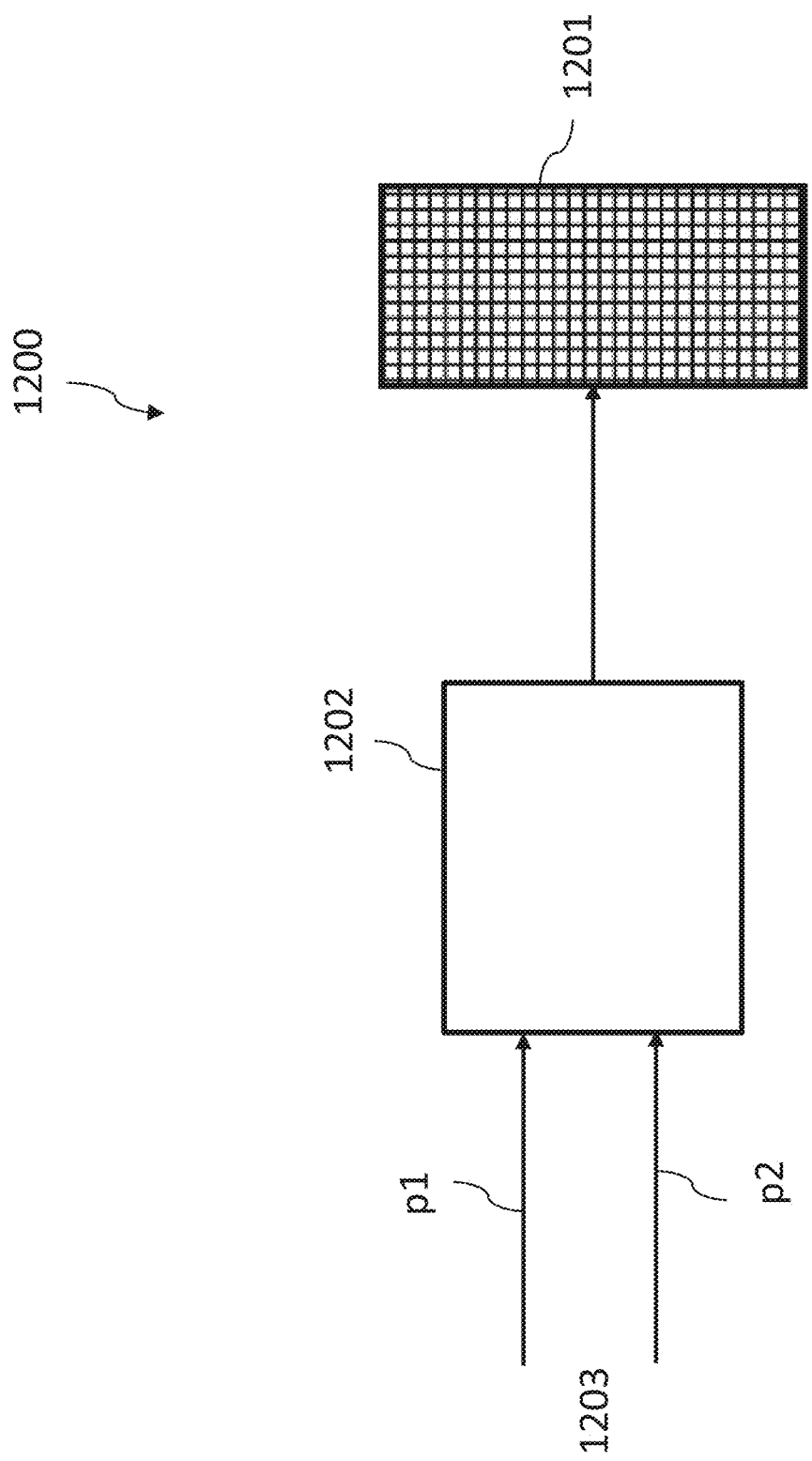
FIG. 12 shows a schematic illustration of a digital to analog conversion means.

FIG. 12 shows a schematic illustration of a digital to analog conversion means 1200 including a plurality of digital to analog converter cells 1201 according to an example. The DAC means 1200 may be similar to the DAC circuits described above, e.g. with respect to FIGS. 1 to 10, for example.

The digital to analog conversion means 1200 includes means for controlling an operation 1202 configured to control an operation of a digital to analog converter cell of the plurality of digital to analog converter cells 1201 based on a first phase component p1 of a digital signal 1203 containing information to be transmitted during a first time interval and based on a second phase component p2 of the digital signal 1203 containing information to be transmitted during a second time interval.

The means for controlling the operation 1202 may include a means for controlling a column operation mode configured to control a column operation mode of a column of digital to analog converter cells, for example. The means for controlling the operation 1202 may include a means for controlling an activation configured to control an activation of a digital to analog converter cell in a column of digital to analog converter cells, for example.

Additionally, the digital to analog conversion means 1200 may further include a means for generating adapted phase components configured to generate a first adapted phase component and a second adapted phase component of a digital signal containing information to be transmitted derivable by a rotation transformation of a first and a second input phase component of a digital signal, for example. The digital to analog converter cell may be configured to generate an analog cell output signal based on the first adapted phase component during the first time interval and based on the second adapted phase component during the second time interval, for example.

More details and aspects are mentioned in connection with the examples described above or below (e.g. the digital signal, the first phase component of the digital signal, the second phase component of the digital signal, and the digital to analog converter cells). The examples shown in FIG. 12 may comprise one or more optional additional features corresponding to one or more aspects mentioned in connection with the proposed concept or one or more examples described above (e.g. FIGS. 1 to 11) or below (e.g. FIGS. 13 to 17).

Figure 13:
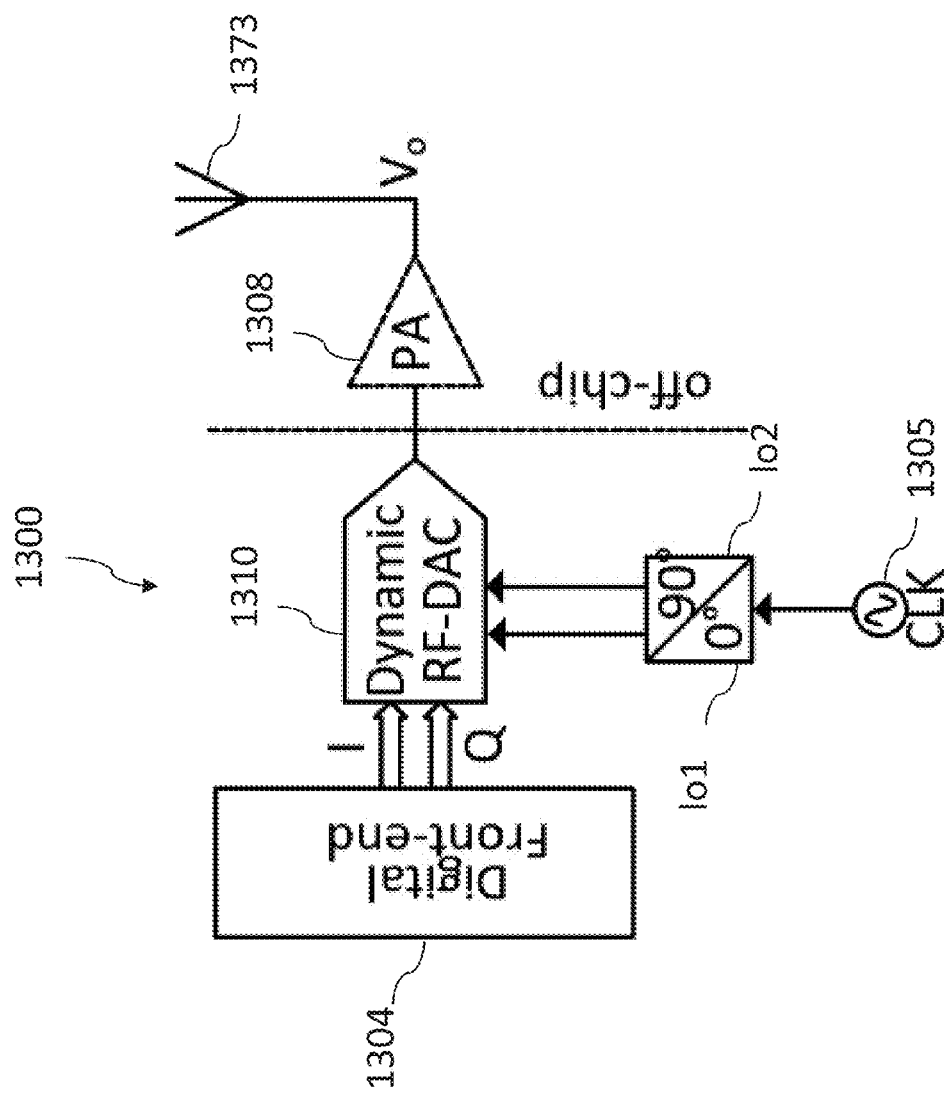
FIG. 13 shows a schematic illustration of a transmitter circuit.

FIG. 13 shows a schematic illustration of a transmitter circuit 1300 according to an example.

The transmitter 1300 may include a baseband processor module 1304 configured to provide a first phase component of a digital signal (e.g. I) and a second phase component (e.g. Q) of the digital signal.

The transmitter 1300 may include a DAC circuit or an apparatus 1310 for generating a high frequency transmission signal, for example. The DAC circuit 1310 may be similar to the DAC circuits described above, e.g. with respect to FIGS. 1 to 12, for example. The apparatus for generating a high frequency transmission signal may be similar to the apparatuses described above, e.g. with respect to FIGS. 7 to 9, for example.

The DAC circuit 1310 may be configured to sum analog cell output signals of the digital to analog converter cells to generate an analog high frequency transmit signal 1306, for example. The DAC circuit 1310 may be configured to generate an analog high frequency transmit signal based on analog cell output signals of the plurality of digital to analog converter cells and to provide the high frequency transmit signal 1306 to an antenna module 1373.

For example, the transmitter may include a power amplifier 1308 configured to amplify the high frequency transmit signal 1306 and to provide the high frequency transmit signal to the antenna module 1373.

The DAC circuit 1310 may include a control circuit and a plurality of DAC cells similar to the DAC described with respect to previous examples, for example.

The DAC circuit 1310 may be coupled to the baseband processor module 1304 (e.g. digital front end circuitry) where signals to be transmitted may be processed digitally, for example. The baseband processor module 1304 may include DSP circuitry and may be configured to provide a digital signal containing information to be transmitted (e.g. a digital transmit signal) to the DAC circuit. For example, the digital front end circuitry 1304 may provide a first phase component of the digital signal and a second phase component of the digital signal to the plurality of DAC cells, for example. The DAC circuit 1310 may convert the digital signal to an analog signal, (e.g. an analog current signal), and may also mix the digital signal and/or analog signal with a local oscillator (LO) signal to output a mixed analog signal.

The first phase component of the digital signal and the second phase component of the digital signal may each include a least part of a multi-bit digital signal containing information to be transmitted, for example. For example, the first phase component of the digital signal may be an in phase component (I) of the digital signal and the second phase component of the digital signal may be a quadrature (Q) component of the digital signal, for example. For example, the schematic illustration may show a block diagram of a dynamic IQ transmitter lineup.

For example, the DAC circuit may include an input, row and column decoders, a cell array, and an output. The column and row decoders may provide control signals in the form of row and column thermometer encoded control signals. At least one of the control signals may be modulated based on a LO signal. For example, synchronization circuitry in the column decoder may modulate the column control signals provided to the cell array based on a local oscillator (LO) signal.

The control circuit of DAC circuit may include an oscillator circuit 1305 (e.g. a local oscillator or a clock CLK) configured to generate a first oscillator signal ICLK and a second oscillator signal QCLK. The oscillator circuit may be configured to provide the first oscillator signal a DAC cell of the plurality of DAC cells during the first time interval and the second oscillator signal to the DAC cell during the second time interval, for example.

The first oscillator signal ICLK and the second oscillator signal QCLK may have a same frequency, for example. The frequency of the first oscillator signal ICLK and the second oscillator signal QCLK may represent a carrier frequency to be used to transmit the information to be transmitted. The first oscillator signal ICLK may have a predefined phase offset and the second oscillator signal QCLK. For example, for transmitting an in phase component (I) of the digital signal and an quadrature (Q) component of the digital signal, the predefined phase offset may be 90°, for example.

The input may receive the multi-bit digital signal, which may be in the form of an eight bit signal (e.g. B0 to B7), for example. Bits B0 to B3, may be the least significant four bits, and may be fed to a thermometer row decoder; and bits B4 to B7, which may be the most significant four bits, may be fed to thermometer column decoder. Thermometer decoders control cell array. When activated by a control signal from the decoders a current source within each cell of the cell array may output a predetermined current. The predetermined current output by a cell is the same as that of each other cell, for example. These currents from any individual activated cells may be summed to generate an analog output signal.

The number of activated cells in array may depend on the eight bit value B0 to B7 and/or other determinations. For example, if a digital value of 0000-0000 (corresponding to a decimal value of zero) is set for B0-B7 and applied to the input, no cell in the cell array is activated and the output current on output is zero, for example. If all bits are set (i.e., B0-B7 are set to a digital value of 1111-1111, corresponding to a decimal value of 255), a predetermined number of cells in the cell array may be activated to yield an output signal which may be 256 times stronger than the output of a single cell, for example.

The power amplifier 1308 may amplify the mixed analog signal to provide an amplified mixed analog signal, which may be provided to the off chip antenna module for wireless transmission, for example.

More details and aspects are mentioned in connection with the examples described above or below (e.g. the digital to analog converter circuit, the digital signal, the digital to analog converter cells, and the transmitter). The examples shown in FIG. 13 may comprise one or more optional additional features corresponding to one or more aspects mentioned in connection with the proposed concept or one or more examples described above (e.g. FIGS. 1 to 12) or below (e.g. FIGS. 14 to 17).

Some examples relate to a transmitter or a transceiver comprising a baseband processor module, a digital to analog converter circuit or an apparatus for generating a high frequency transmission signal according to one of the examples described above or below and a power amplifier. The baseband processor module is configured to provide a first phase component of a digital signal and a second phase component of the digital signal. Further, the digital to analog converter circuit or the apparatus for generating a high frequency transmission signal is configured to generate an analog high frequency transmit signal. Additionally, the power amplifier is configured to amplify the high frequency transmit signal and to provide the high frequency transmit signal to an antenna module.

For example, the transmitter or a transceiver may be an OFDM transmitter or a transceiver.

More details and aspects are mentioned in connection with the examples described above or below (e.g. the digital to analog converter circuit, the digital signal, the digital to analog converter cells, and the transmitter). The transmitter or a transceiver may comprise one or more optional additional features corresponding to one or more aspects mentioned in connection with the proposed concept or one or more examples described above (e.g. FIGS. 1 to 17).

Figure 14:
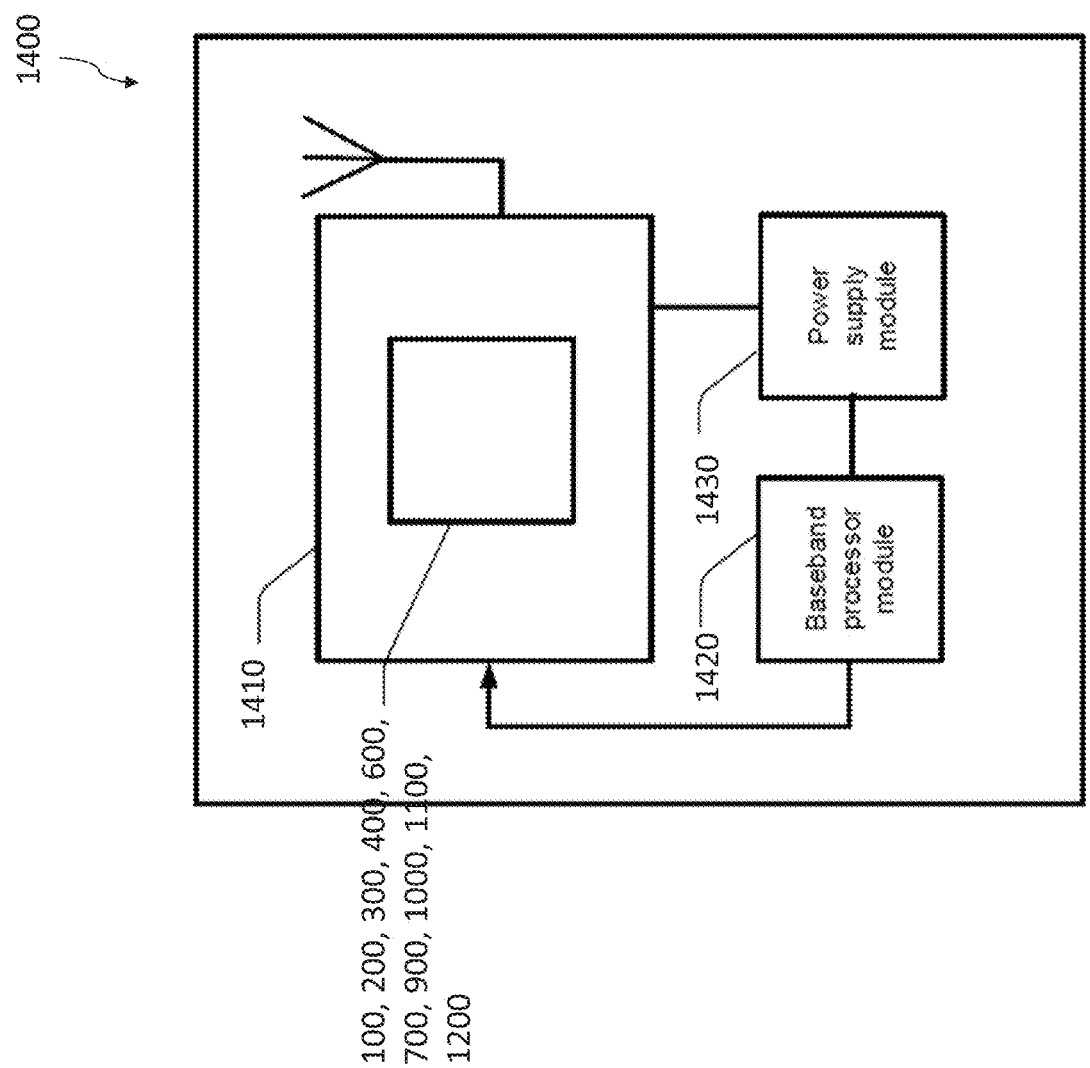
FIG. 14 shows a block diagram of a mobile device.

FIG. 14 shows a schematic illustration of a mobile device 1400. The mobile device comprises a digital to analog converter circuit (e.g. 100, 200, 300, 400, 600, 700, 900, 1000, 1100 or digital to analog conversion means 1200 described in FIGS. 1 to 13) for digital to analog conversion within a transmitter or a transceiver 1410. Further, the mobile device 1410 comprises a baseband processor module 1420 generating at least the digital (e.g. baseband) signal to be transmitted and/or processing a baseband receive signal. Additionally, the mobile device 1400 comprises a power supply unit 1430 supplying at least the transmitter or the transceiver 1410 and the baseband processor module 1420 with power.

Further examples relate to a mobile device (e.g. a cell phone, a tablet or a laptop) comprising a transmitter or a transceiver described above. The mobile device or mobile terminal may be used for communicating in a mobile communication system.

In some examples, a cell phone may comprise a transmitter or a transceiver comprising digital to analog converter circuit according to the proposed concept or one or more examples described above.

More details and aspects are mentioned in connection with the examples described above or below (e.g. the digital to analog converter circuit, the digital signal, the first phase component of the digital signal, the second phase component of the digital signal, the digital to analog converter cells, the control circuit, the row and column decoders, the first and second column codes and the first and second row codes, the transmitter, and the analog output signals). The examples shown in FIG. 14 may comprise one or more optional additional features corresponding to one or more aspects mentioned in connection with the proposed concept or one or more examples described above (e.g. FIGS. 1 to 13) or below (e.g. FIGS. 15 to 17).

Figure 15:
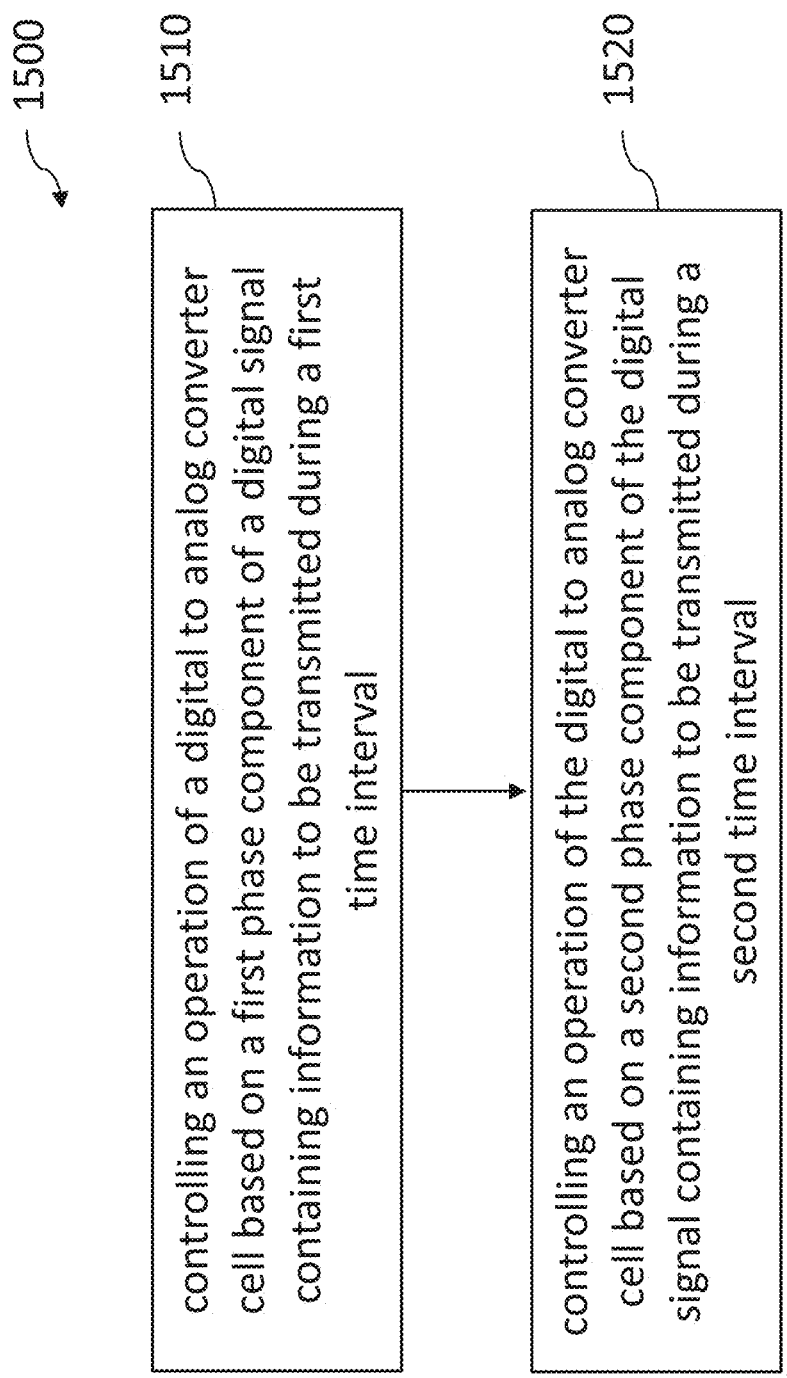
FIG. 15 shows a flowchart of a method for digital to analog signal conversion.

FIG. 15 shows a flowchart of a method 1500 for digital to analog signal conversion according to an example.

The method 1500 includes controlling 1510 a first operation of a digital to analog converter cell based on a first phase component of a digital signal containing information to be transmitted during a first time interval.

The method 1500 further includes controlling 1520 a second operation of the digital to analog converter cell based on a second phase component of the digital signal containing information to be transmitted during a second time interval.

Due to the operation of the digital to analog converter cell based on the first phase component and the second phase component of the digital signal, higher efficiency and smaller DAC area for the same resolution and improved linearity may be achieved, for example. For example, the minimum total size of the DAC circuit (e.g. the total number of DAC cells in a DAC array) may be reduced, for example.

The method 1500 may further include controlling a column operation mode of a column of digital to analog converter cells based on a first column code derived from at least part of the first phase component of the digital signal and based on a second column code derived from at least part of the second phase component of the digital signal, for example.

The method 1500 may further include providing a last column signal based on a last column of digital to analog converter cells operating in a first column operation mode and a second last column signal based on a last column of digital to analog converter cells operating in a second operation mode, for example.

The method 1500 may further include deriving a first row code based on at least part of the first phase component of the digital signal and a second row code based on at least part of the second phase component of the digital signal, for example.

The method 1500 may further include controlling an activation of a digital to analog converter cell in the column of digital to analog converter cells based on the column operation mode and at least one of the first row code and the second row code or without consideration of the first row code or second row code, for example.

The method 1500 may further include generating analog cell output signals during the first time interval and the second time interval, wherein an analog cell output signal generated during the first time interval has an equal frequency and a predefined phase offset with respect to an analog cell output signal generated during the second time interval, for example.

More details and aspects are mentioned in connection with the examples described above or below (e.g. the digital signal, the first phase component of the digital signal, the second phase component of the digital signal, the digital to analog converter cells, the first and second column codes and the first and second row codes, and the analog output signals). The examples shown in FIG. 15 may comprise one or more optional additional features corresponding to one or more aspects mentioned in connection with the proposed concept or one or more examples described above (e.g. FIGS. 1 to 14) or below (e.g. FIGS. 16 to 17).

Figure 16:
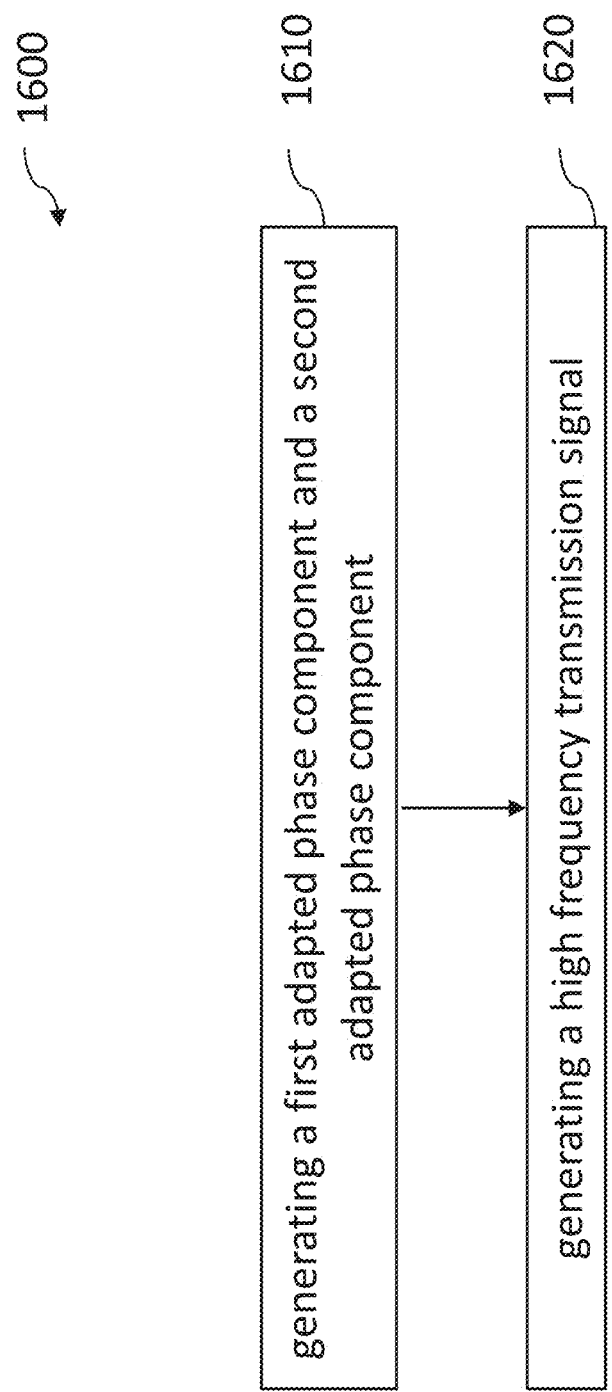
FIG. 16 shows a flowchart of a method for generating a high frequency transmission signal.

FIG. 16 shows a flowchart of a method for generating a high frequency transmission signal according to an example.

The method 1600 includes generating 1610 a first adapted phase component and a second adapted phase component of a digital signal containing information to be transmitted derivable by a rotation transformation of a first and a second input phase component of a digital signal.

The method 1600 further includes generating 1620 a high frequency transmission signal based on the first adapted phase component and the second adapted phase component of the digital signal.

Due to the generation of a first adapted phase component and the second adapted phase component of the digital signal, and generating the high frequency transmission signal based on the first adapted phase component and the second adapted phase component of the digital signal, the output power may be increased (e.g. doubled) assuming the same silicon area and with much efficiency, for example.

The method 1600 may further include providing error correction of at least one of the first adapted phase component and the second adapted phase component based on a value of the first adapted phase component and the second adapted phase component, for example.

The method 1600 may further include summing analog cell output signals of the digital to analog converter cells to generate an analog high frequency transmit signal, for example.

The method 1600 may further include amplifying the high frequency transmit signal, for example.

The method 1600 may further include providing the high frequency transmit signal to an antenna module, for example.

More details and aspects are mentioned in connection with the examples described above or below (e.g. the digital signal, the first and second phase components of the digital signal, the first and second adapted phase components of the digital signal, the digital to analog converter cells, the first and second column codes and the first and second row codes, and the analog output signals). The examples shown in FIG. 16 may comprise one or more optional additional features corresponding to one or more aspects mentioned in connection with the proposed concept or one or more examples described above (e.g. FIGS. 1 to 15) or below (e.g. FIG. 17).

Figure 17:
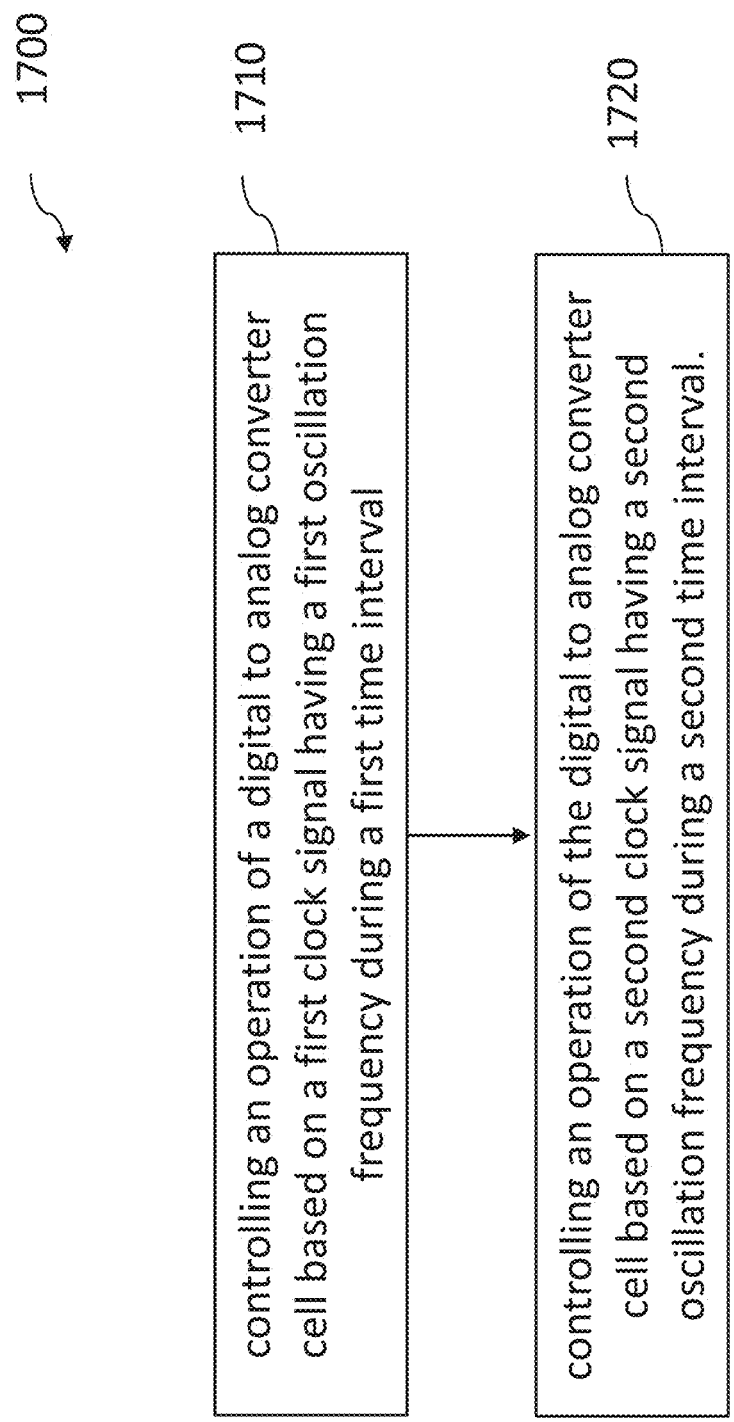
FIG. 17 shows a flowchart of a further method for digital to analog signal conversion.

FIG. 17 shows a flowchart 1700 of a further method for digital to analog signal conversion according to an example.

The method 1700 includes controlling 1710 an operation of a digital to analog converter cell based on a first clock signal having a first oscillation frequency during a first time interval.

The method 1700 further includes controlling 1720 an operation of the digital to analog converter cell based on a second clock signal having a second oscillation frequency during a second time interval.

Due to the operation of the digital to analog converter cell based on first clock signal having the first oscillation frequency during a first time interval and based on the second clock signal having a second oscillation frequency during a second time interval, higher efficiency and smaller DAC area for the same resolution and improved linearity may be achieved, for example. For example, the minimum total size of the DAC circuit (e.g. the total number of DAC cells in a DAC array) may be reduced, for example.

The method 1700 may further include providing an analog high frequency signal based on two or more phase components of a digital signal containing information to be transmitted, for example.

The method 1700 may further include controlling the operation of the digital to analog converter cell based on the same phase component of a digital signal containing information to be transmitted during the first time interval and the second time interval, for example.

More details and aspects are mentioned in connection with the examples described above or below (e.g. the digital signal, phase components of the digital signal, the digital to analog converter cells, and the first and second clock signals). The examples shown in FIG. 16 may comprise one or more optional additional features corresponding to one or more aspects mentioned in connection with the proposed concept or one or more examples described above (e.g. FIGS. 1 to 16) or below.

Various examples relate to a machine readable storage medium including program code, when executed, to cause a machine to perform the method 1500, 1600 or 1700.

Various examples relate to a computer program having a program code for performing the method 1500, 1600 or 1700 when the computer is executed on a computer or processor.

Various examples relate to a machine readable storage including machine readable instructions, when executed, to implement a method 1500, 1600 or 1700 or realize a DAC circuit 100, 200, 300, 400, 600, 700, 900, 1000, or 1100 or a digital to analog conversion means 1200.

Various examples relate to dynamic multi-phase DAC Architecture. For example, various examples related to digital to analog converters such as IQ DACs, with improved efficiency, linearity. Various examples refer to a DAC device which may be produced with high volume architecture, and which may be embodied in computer system architectures features & interfaces and made in high volumes. Various examples relate to IA (input architecture), devices (e.g., transistors) and associated manufacturing processes, e.g. MOS and/or CMOS Various examples relate to an IQ RFDAC with improved efficiency and output power. Various examples relate to improving a transmitter for wireless devices. Polar architecture is currently used for cellular transmitters, whereas IQ architecture is used for WIFI. IQ is much more simple as no modulated clock is needed, and so no modulated phase locked loop (PLL) or digital time clock (DTC) is necessary, for example. Various examples improve the efficiency of IQ to the level of polar, thus reducing any drawbacks of IQ having lower efficiency. The complexity is shifted to digital processing and is simple in modern technologies, for example.

Various examples may be implemented with related devices, such as digital to analog converters (DAC), e.g. 12 or 13 bits, greater than 200 MSPS (mega samples per second); DACs greater than 14 bits and greater than 20 MSPS; DACs greater than 10 or 11 bits and greater than 300 MSPS; and DACs greater than 12 or 13 bits and greater than 125 MSPS;

Various examples may be implemented with related devices, such as 3GPP LTE UE modem, for example.

In comparison to a proposed DAC, a polar radio frequency digital to analog converter (RFDAC) may use all cells to generate an output signal, for example. Polar RFDACs may suffer from non-uniform distribution, and most bits e.g. bits (f) may be where they are not needed, for example. Quadrature amplitude modulation (QAM) may be similar to a thermometric code in amplitude or radius (r) and phase (f). The error vector magnitude (EVM) may be defined by an error at rmax. For example, the number of r bits may be equal to 1.4×I (in-phase). The number of f bits may be equal to 2p×I (which may be greater than or equal to 3 more bits, for example). Challenges associated with frequency modulation (fm) of the digital control oscillator (DCO) may be present. The maximum phase jump per cycle may be limited by a maximum tuning range (<20%), for example. Errors made during zero-crossing, e.g. gigahertz GHz jump) may lead to errors at the symbol, for example.

IQ modulators may use a limited amount of DAC cells to generate an output signal. For example, in comparison to a proposed DAC, other IQ transmitter lineups may have two DACs, one for the in-phase I path, and one for the quadrature Q path. IQ architecture may be simple but may suffer from lower efficiency and lower output power. The reason for this may be that due to the IQ modulators being built from two digital to analog converters DACs, one DAC (e.g. an I array having 512+5 cells) may be used for the in-phase (I) and the other DAC (e.g. a Q array having 512+5 cells) may be used for the quadrature (Q) whose outputs are summed up, for example. An IQ modulator may use a limited number of DAC-cells to generate the output signal. For example, based on an IQ constellation diagram for an IQ DAC, when Q is at a maximum and I is 0, only the Q DAC is used. If I were to be at a maximum and Q is 0, only the I DAC is used, for example. In the RFDAC, the DACs used for I and Q signal chains may directly generate analog signals in the RF domain. Thus, the composite signal after the I plus Q sum may be ready for transmission, for example. The signal may eventually be amplified by a power amplifier PA before going to the antenna if needed, for example.

In the following examples pertain to further examples. Example 1 is a digital to analog converter circuit comprising a plurality of digital to analog converter cells and a control circuit configured to control an operation of a digital to analog converter cell of the plurality of digital to analog converter cells based on a first phase component of a digital signal comprising information to be transmitted during a first time interval and based on a second phase component of the digital signal comprising information to be transmitted during a second time interval.

In example 2, the subject matter of example 1 can optionally include each digital to analog converter cell of the plurality of digital to analog converter cells being assigned to a cell row of a plurality of cell rows and a cell column of a plurality of cell columns.

In example 3, the subject matter of example 1 or 2 can optionally include the control circuit comprising a decoder control circuit configured to control a column operation mode of a column of digital to analog converter cells.

In example 4, the subject matter of example 3 can optionally include the decoder control circuit being configured to control the column operation mode of a column of digital to analog converter cells based on a first column code derived from at least part of the first phase component of the digital signal and based on a second column code derived from at least part of the second phase component of the digital signal.

In example 5, the subject matter of example 4, can optionally include the decoder control circuit comprising a first column decoder circuit configured to derive the first column code based on at least part of the first phase component of the digital signal and a second column decoder circuit configured to derive the second column code based on at least part of the second phase component of the digital signal.

In example 6, the subject matter of example 5 can optionally include the first column decoder circuit being configured to derive the first column code based on most significant bits of the first phase component of the digital signal, and the second column decoder circuit being configured to derive the second column code based on most significant bits of the second phase component of the digital signal.

In example 7, the subject matter of example 5 or 6 can optionally include the decoder control circuit comprising an XOR gate or OR gate associated with a cell column of a plurality of cells columns, wherein the XOR gate or OR gate is coupled to the first column decoder circuit and the second column decoder circuit, wherein an output signal of the XOR gate or OR gate indicates a column operation mode of the cell column.

In example 8, the subject matter of one of examples 3 to 7 can optionally include the decoder control circuit being configured to provide a last column signal indicating a last column of digital to analog converter cells operating in a first column operation mode and a last column signal indicating a last column of digital to analog converter cells operating in a second operation mode.

In example 9, the subject matter of one of examples 3 to 8 can optionally include at least one inactive column of digital to analog converter cells located between the last column of digital to analog converter cells operating in the first column operation mode and the last column of digital to analog converter cells operating in the second column operation mode.

In example 10, the subject matter of one of examples 1 to 9 can optionally include the control circuit further comprising a first row decoder circuit configured to derive a first row code based on at least part of the first phase component of the digital signal and a second row decoder circuit configured to derive a second row code based on at least part of the second phase component of the digital signal.

In example 11, the subject matter of one of examples 1 to 10 can optionally include the control circuit comprising a local activation control circuit configured to control an activation of a digital to analog converter cell in a column of digital to analog converter cells.

In example 12, the subject matter of example 11 can optionally include the local activation control circuit being configured to control an activation of the digital to analog converter cell based on a column operation mode and at least one of the first row code and the second row code or without consideration of the first row code or second row code.

In example 13, the subject matter of example 11 or 12 can optionally include the local activation control circuit being configured to switch the digital to analog converter cell with a frequency of an oscillator signal if the digital to analog converter cell is activated.

In example 14, the subject matter of any one of the previous examples can optionally include the control circuit comprising an oscillator circuit configured to generate a first oscillator signal and a second oscillator signal, wherein the first oscillator signal and the second oscillator signal comprise a same frequency representing a carrier frequency to be used to transmit the information to be transmitted and comprises a predefined phase offset.

In example 15, the subject matter of example 14 can optionally include the oscillator circuit being configured to provide the first oscillator signal to a column of digital to analog converter cells operating in a first column operation mode and the second oscillator signal to a column of digital to analog converter cells operating in a second column operation mode.

In example 16, the subject matter of any one of the previous examples can optionally include the digital to analog converter cells of the plurality of digital to analog converter cells each comprising a switchable current source or a switchable capacitive element to produce a cell analog output signal having a first analog output state or a second analog output state.

In example 17, the subject matter of any one of the previous examples can optionally include the digital to analog converter cell being configured to generate analog cell output signals during the first time interval and the second time interval, wherein an analog cell output signal generated during the first time interval has an equal frequency and a predefined phase offset with respect to an analog cell output signal generated during the second time interval.

In example 18, the subject matter of example 17 can optionally include the digital to analog converter cell being configured to generate an analog cell output signal based on a first oscillator signal during the first time interval and to generate an analog cell output signal based on a second oscillator signal during the second time interval, wherein the first oscillator signal and the second oscillator signal comprise the predefined phase offset.

In example 19, the subject matter of any one of the previous examples can optionally include the first phase component of the digital signal being an in phase component of the digital signal and the second phase component of the digital signal being a quadrature component of the digital signal.

In example 20, the subject matter of any one of the previous examples can optionally include a signal converter circuit configured to generate a first adapted phase component and a second adapted phase component of the digital signal comprising information to be transmitted derivable by a rotation transformation of the first and the second input phase component of the digital signal, and the digital to analog converter cell being configured to generate an analog cell output signal based on the first adapted phase component during the first time interval and based on the second adapted phase component during the second time interval.

In example 21, the subject matter of any one of the previous examples can optionally include or be a thermometric coding-based digital to analog converter circuit.

In example 22, the subject matter of any one of the previous examples can optionally include a digital to analog converter circuit configure to provide an analog high frequency signal by summing analog cell output signals of the plurality of digital to analog converter cells.

In example 23, the subject matter of any one of the previous examples can optionally include the plurality of digital to analog converter cells being arranged in a single array.

Example 24 is an apparatus for generating a high frequency transmission signal comprising a signal converter configured to generate a first adapted phase component and a second adapted phase component of a digital signal comprising information to be transmitted derivable by a rotation transformation of a first and a second input phase component of a digital signal, and an up conversion module configured to generate a high frequency transmission signal based on the first adapted phase component and the second adapted phase component of the digital signal.

In example 25, the subject matter of example 24 can optionally include the up conversion module comprising a digital to analog converter circuit according to one of the examples 1 to 23.

In example 26, the subject matter of example 24 or 25 can optionally include a conversion correction circuit configured to correct a sign error of at least one of the first adapted phase component and the second adapted phase component based on a value of the first adapted phase component and the second adapted phase component.

In example 27, the subject matter of example 25 or 26 can optionally include the control circuit comprises a decoder control circuit configured to control a column operation mode of a column of digital to analog converter cells.

Example 28 is a digital to analog converter circuit comprising a plurality of digital to analog converter cells, and a control circuit configured to control an operation of a digital to analog converter cell of the plurality of digital to analog converter cells based on a first clock signal having a first oscillation frequency during a first time interval and based on a second clock signal having a second oscillation frequency during a second time interval.

In example 29, the subject matter of example 28 can optionally include being configured to provide an analog high frequency signal based on two or more phase components of a digital signal comprising information to be transmitted.

In example 30, the subject matter of example 28 or 29 can optionally include the control circuit being configured to control the operation of the digital to analog converter cell based on the same phase component of a digital signal comprising information to be transmitted during the first time interval and the second time interval.

Example 31 is a digital to analog conversion means comprising a plurality of digital to analog converter cells, the digital to analog conversion means comprising means for controlling an operation configure to control an operation of a digital to analog converter cell of the plurality of digital to analog converter cells based on a first phase component of a digital signal comprising information to be transmitted during a first time interval and based on a second phase component of the digital signal comprising information to be transmitted during a second time interval.

In example 32, the subject-matter of example 31 can optionally include the means for controlling the operation comprising a means for controlling a column operation mode configured to control a column operation mode of a column of digital to analog converter cells.

In example 33, the subject-matter of example 31 or 32 can optionally include the means for controlling the operation comprising means for controlling an activation configured to control an activation of a digital to analog converter cell in a column of digital to analog converter cells.

In example 34, the subject-matter of any one of examples 31 to 33 can optionally include a means for generating adapted phase components configured to generate a first adapted phase component and a second adapted phase component of a digital signal comprising information to be transmitted derivable by a rotation transformation of a first and a second input phase component of a digital signal, wherein the digital to analog converter cell is configured to generate an analog cell output signal based on the first adapted phase component during the first time interval and based on the second adapted phase component during the second time interval.

Example 35 is a transmitter comprising a baseband processor module configured to provide a first phase component of a digital signal and a second phase component of the digital signal, a digital to analog converter circuit or an apparatus for generating a high frequency transmission signal according to any of the previous examples configured to sum generate an analog high frequency transmit signal, and a power amplifier configured to amplify the high frequency transmit signal and to provide the high frequency transmit signal to an antenna module.

Example 36 is a transmitter or a transceiver comprising a digital to analog converter circuit or an apparatus for generating a high frequency transmission signal according to any of the previous examples configured to generate an analog high frequency transmit signal based on analog cell output signals of the plurality of digital to analog converter cells and to provide the high frequency transmit signal to an antenna module.

Example 37 is a mobile device comprising a transmitter or a transceiver according to example 36.

Example 38 is a cell phone comprising a transmitter or a transceiver according to example 36.

Example 39 is a method of digital to analog signal conversion, the method comprising controlling a first operation of a digital to analog converter cell based on a first phase component of a digital signal comprising information to be transmitted during a first time interval and controlling a second operation of the digital to analog converter cell based on a second phase component of the digital signal comprising information to be transmitted during a second time interval.

In example 40, the subject matter of example 39 can optionally include controlling a column operation mode of a column of digital to analog converter cells based on a first column code derived from at least part of the first phase component of the digital signal and based on a second column code derived from at least part of the second phase component of the digital signal.

In example 41, the subject matter of example 39 or 40 can optionally include providing a last column signal indicating a last column of digital to analog converter cells operating in a first column operation mode and a second last column signal indicating a last column of digital to analog converter cells operating in a second operation mode.

In example 42, the subject matter of any one of example 39 to 41 can optionally include deriving a first row code based on at least part of the first phase component of the digital signal and a second row code based on at least part of the second phase component of the digital signal.

In example 43, the subject matter of example 42 can optionally include controlling an activation of a digital to analog converter cell in the column of digital to analog converter cells based on the column operation mode and at least one of the first row code and the second row code or without consideration of the first row code or second row code.

In example 44, the subject matter of any one of example 39 to 43 can optionally include generating analog cell output signals during the first time interval and the second time interval, wherein an analog cell output signal generated during the first time interval has an equal frequency and a predefined phase offset with respect to an analog cell output signal generated during the second time interval.

Example 45 is a method for generating a high frequency transmission signal, the method comprising generating a first adapted phase component and a second adapted phase component of a digital signal comprising information to be transmitted derivable by a rotation transformation of a first and a second input phase component of a digital signal, and generating a high frequency transmission signal based on the first adapted phase component and the second adapted phase component of the digital signal.

In example 46, the subject matter of example 45 can optionally include correcting a sign error of at least one of the first adapted phase component and the second adapted phase component based on a value of the first adapted phase component and the second adapted phase component.

In example 47, the subject matter of example 45 or 46 can optionally include summing analog cell output signals of the digital to analog converter cells to generate an analog high frequency transmit signal, amplifying the high frequency transmit signal, and providing the high frequency transmit signal to an antenna module.

Example 48 is a method of digital to analog signal conversion, the method comprising controlling an operation of a digital to analog converter cell based on a first clock signal having a first oscillation frequency during a first time interval and controlling an operation of the digital to analog converter cell based on a second clock signal having a second oscillation frequency during a second time interval.

In example 49, the subject matter of example 48 can optionally include providing an analog high frequency signal based on two or more phase components of a digital signal comprising information to be transmitted.

In example 50, the subject matter of example 49 can optionally include controlling the operation of the digital to analog converter cell based on the same phase component of a digital signal comprising information to be transmitted during the first time interval and the second time interval.

Example 51 is a machine readable storage medium including program code, when executed, to cause a machine to perform the method of one of the examples 39 to 50.

Example 52 is a machine readable storage including machine readable instructions, when executed, to implement a method or realize an apparatus in any previous example.

Example 53 is a computer program having a program code for performing the method of one of the examples 39 to 50 when the computer is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A digital to analog converter circuit comprising:
    a plurality of digital to analog converter cells; and
    a control circuit configured to control an operation of a digital to analog converter cell of the plurality of digital to analog converter cells based on a first phase component of a digital signal comprising information to be transmitted during a first time interval and based on a second phase component of the digital signal comprising information to be transmitted during a second time interval.

2. The digital to analog converter circuit according to claim 1, wherein each digital to analog converter cell of the plurality of digital to analog converter cells is assigned to a cell row of a plurality of cell rows and a cell column of a plurality of cell columns.

3. The digital to analog converter circuit according to claim 1, wherein the control circuit comprises a decoder control circuit configured to control a column operation mode of a column of digital to analog converter cells.

4. The digital to analog converter circuit according to claim 3, wherein the decoder control circuit is configured to control the column operation mode of a column of digital to analog converter cells based on a first column code derived from at least part of the first phase component of the digital signal and based on a second column code derived from at least part of the second phase component of the digital signal.

5. The digital to analog converter circuit according to claim 4, wherein the decoder control circuit comprises a first column decoder circuit configured to derive the first column code based on at least part of the first phase component of the digital signal and a second column decoder circuit configured to derive the second column code based on at least part of the second phase component of the digital signal.

6. The digital to analog converter circuit according to claim 5, wherein the first column decoder circuit is configured to derive the first column code based on most significant bits of the first phase component of the digital signal, and wherein the second column decoder circuit is configured to derive the second column code based on most significant bits of the second phase component of the digital signal.

7. The digital to analog converter circuit according to claim 5, wherein the decoder control circuit comprises an XOR gate or OR gate associated with a cell column of a plurality of cell columns, wherein the XOR gate or OR gate is coupled to the first column decoder circuit and the second column decoder circuit, wherein an output signal of the XOR gate or OR gate indicates a column operation mode of the cell column.

8. The digital to analog converter circuit according to claim 3, wherein the decoder control circuit is configured to provide a last column signal indicating a last column of digital to analog converter cells operating in a first column operation mode and a last column signal indicating a last column of digital to analog converter cells operating in a second operation mode.

9. The digital to analog converter circuit according to claim 3, comprising at least one inactive column of digital to analog converter cells located between the last column of digital to analog converter cells operating in the first column operation mode and the last column of digital to analog converter cells operating in the second column operation mode.

10. The digital to analog converter circuit according to claim 1, wherein the control circuit further comprises a first row decoder circuit configured to derive a first row code based on at least part of the first phase component of the digital signal and a second row decoder circuit configured to derive a second row code based on at least part of the second phase component of the digital signal.

11. The digital to analog converter circuit according to claim 1, wherein the control circuit comprises a local activation control circuit configured to control an activation of a digital to analog converter cell in a column of digital to analog converter cells.

12. The digital to analog converter circuit according to claim 11, wherein the local activation control circuit is configured to control an activation of the digital to analog converter cell based on the column operation mode and at least one of the first row code and the second row code or without consideration of the first row code or second row code.

13. The digital to analog converter circuit according to claim 11, wherein the local activation control circuit is configured to switch the digital to analog converter cell with a frequency of an oscillator signal if the digital to analog converter cell is activated.

14. The digital to analog converter circuit according to claim 1, wherein the control circuit comprises an oscillator circuit configured to generate a first oscillator signal and a second oscillator signal, wherein the first oscillator signal and the second oscillator signal comprise a same frequency representing a carrier frequency to be used to transmit the information to be transmitted and comprise a predefined phase offset.

15. The digital to analog converter circuit according to claim 14, wherein the control circuit is configured to provide the first oscillator signal to a column of digital to analog converter cells operating in a first column operation mode and the second oscillator signal to a column of digital to analog converter cells operating in a second column operation mode.

16. The digital to analog converter circuit according to claim 1, wherein the digital to analog converter cells of the plurality of digital to analog converter cells each comprise a switchable current source or a switchable capacitive element to produce a cell analog output signal having a first analog output state or a second analog output state.

17. An apparatus for generating a high frequency transmission signal, comprising:
a signal converter configured to generate a first adapted phase component and a second adapted phase component of a digital signal comprising information to be transmitted derivable by a rotation transformation of a first and a second input phase component of a digital signal; and
an up conversion module configured to generate a high frequency transmission signal based on the first adapted phase component and the second adapted phase component of the digital signal.

18. The apparatus according to claim 17, wherein the up conversion module comprises a digital to analog converter circuit comprising:
a plurality of digital to analog converter cells; and
a control circuit configured to control an operation of a digital to analog converter cell of the plurality of digital to analog converter cells based on a first phase component of a digital signal comprising information to be transmitted during a first time interval and based on a second phase component of the digital signal comprising information to be transmitted during a second time interval.

19. The apparatus according to claim 18, wherein the control circuit comprises a decoder control circuit configured to control a column operation mode of a column of digital to analog converter cells.

20. The apparatus according to claim 17, further comprising a conversion correction circuit configured to correct a sign error of at least one of the first adapted phase component and the second adapted phase component based on a value of the first adapted phase component and the second adapted phase component.

21. A digital to analog converter circuit comprising:
a plurality of digital to analog converter cells; and
a control circuit configured to output a first clock signal having a first oscillation frequency during a first time interval and a second, different clock signal, distinct from the first clock signal, having a second oscillation frequency during a second time interval, to control an operation of a digital to analog converter cell of the plurality of digital to analog converter cells.

22. The digital to analog converter circuit according to claim 21, wherein the plurality of digital to analog converter cells are configured to provide an analog high frequency signal based on two or more phase components of a digital signal comprising information to be transmitted.

23. The digital to analog converter circuit according to claim 21, wherein the control circuit is configured to control the operation of the digital to analog converter cell based on the same phase component of a digital signal comprising information to be transmitted during the first time interval and the second time interval.

24. A method of digital to analog signal conversion, the method comprising controlling a first operation of a digital to analog converter cell based on a first phase component of a digital signal comprising information to be transmitted during a first time interval; and controlling a second operation of the digital to analog converter cell based on a second phase component of the digital signal comprising information to be transmitted during a second time interval.

* * * * *